(12) United States Patent
Aono

(10) Patent No.: US 9,927,874 B2
(45) Date of Patent: Mar. 27, 2018

(54) INPUT APPARATUS AND CONTROL METHOD FOR INPUT APPARATUS

(75) Inventor: Tomotake Aono, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 67 days.

(21) Appl. No.: 13/387,712

(22) PCT Filed: Jul. 28, 2010

(86) PCT No.: PCT/JP2010/004801
§ 371 (c)(1),
(2), (4) Date: Jan. 27, 2012

(87) PCT Pub. No.: WO2011/013372
PCT Pub. Date: Feb. 3, 2011

(65) Prior Publication Data
US 2012/0133496 A1    May 31, 2012

(30) Foreign Application Priority Data

Jul. 29, 2009 (JP) .................................. 2009-177069
Jun. 30, 2010 (JP) .................................. 2010-149641

(51) Int. Cl.
G06F 3/044    (2006.01)
G06F 3/01    (2006.01)
(Continued)

(52) U.S. Cl.
CPC .............. G06F 3/016 (2013.01); G06F 3/017 (2013.01); G06F 3/044 (2013.01); G06F 3/0414 (2013.01);
(Continued)

(58) Field of Classification Search
CPC .................... G06F 3/041; G06F 3/016; G06F 2203/04105; G06F 3/011
(Continued)

(56) References Cited

U.S. PATENT DOCUMENTS 5,347,870 A * 9/1994 Dosch ...................... G01B 7/00
                                                          310/319
7,292,227 B2 * 11/2007 Fukumoto .......... G01C 21/3664
                                                          178/18.04
(Continued)

FOREIGN PATENT DOCUMENTS

CN         1392977 A        1/2003
CN         1255710 C        5/2006
(Continued)

OTHER PUBLICATIONS

Japanese Office Action "Notification of Reasons for Refusal" dated Dec. 21, 2009; Japanese Patent Application No. 2009-177069 with translation.
(Continued)

*Primary Examiner* — Steven Lim
*Assistant Examiner* — Mancil Littlejohn, Jr.
(74) *Attorney, Agent, or Firm* — Studebaker & Brackett PC

(57) ABSTRACT

An input apparatus has a touch sensor 11 configured to receive an input, a load detection unit 12 configured to detect a pressure load on a touch face 11a of the touch sensor 11, a tactile sensation providing unit 13 configured to vibrate the touch face 11a, and a control unit 15 configured to control drive of the tactile sensation providing unit 13, when the pressure load detected by the load detection unit 12 satisfies a standard to provide a tactile sensation, such that a click sensation is provided to an object (means) pressing the touch face 11a. Thereby, a realistic click sensation similar to that obtained when a push-button switch is operated is provided when an operator operates the touch sensor.

4 Claims, 24 Drawing Sheets

(51) Int. Cl.
*G06F 3/041* (2006.01)
*H03K 17/96* (2006.01)

(52) U.S. Cl.
CPC ....... *G06F 3/0416* (2013.01); *H03K 17/9625* (2013.01); *G06F 2203/04106* (2013.01); *G06F 2203/04808* (2013.01); *H03K 2217/96062* (2013.01)

(58) Field of Classification Search
USPC ........... 340/407.1, 407.2; 345/173, 156, 158, 345/179, 161, 169
See application file for complete search history.

(56) References Cited

U.S. PATENT DOCUMENTS

| | | | |
|---|---|---|---|
| 7,683,889 B2 * | 3/2010 | Rimas Ribikauskas | G06F 3/0414 178/18.01 |
| 2002/0149561 A1 | 10/2002 | Fukumoto et al. | |
| 2005/0156904 A1 | 7/2005 | Katayose | |
| 2006/0109256 A1 * | 5/2006 | Grant | G06F 3/016 345/173 |
| 2008/0024459 A1 | 1/2008 | Poupyrev et al. | |
| 2008/0158152 A1 | 7/2008 | Parker | |
| 2009/0060287 A1 * | 3/2009 | Hyde et al. | 382/118 |
| 2009/0167704 A1 * | 7/2009 | Terlizzi et al. | 345/173 |
| 2010/0090814 A1 * | 4/2010 | Cybart | G06F 3/016 340/407.2 |
| 2010/0141606 A1 * | 6/2010 | Bae et al. | 345/174 |
| 2010/0156818 A1 * | 6/2010 | Burrough | G06F 3/016 345/173 |
| 2011/0102355 A1 | 5/2011 | Aono et al. | |
| 2011/0102358 A1 * | 5/2011 | Aono | G06F 3/016 345/173 |
| 2011/0157052 A1 | 6/2011 | Lee et al. | |
| 2011/0279381 A1 | 11/2011 | Tong et al. | |

FOREIGN PATENT DOCUMENTS

| | | | | |
|---|---|---|---|---|
| CN | 1808360 A | | 7/2006 | |
| CN | 101118469 A | | 2/2008 | |
| CN | 101211244 A | | 7/2008 | |
| JP | 2003-288158 A | | 10/2003 | |
| JP | 2005-190290 A | | 7/2005 | |
| JP | 2005-258666 A | | 9/2005 | |
| JP | 2005-332063 A | | 12/2005 | |
| JP | 2006-195734 A | | 7/2006 | |
| JP | 2008-130055 A | | 6/2008 | |
| JP | 2010-146507 A | | 7/2010 | |
| JP | 2010146510 A | * | 7/2010 | G06F 3/016 |
| KR | 10-2002-0037771 A | | 5/2002 | |
| KR | 10-2009-0006737 A | | 1/2009 | |
| TW | 201017491 A | | 5/2010 | |
| WO | 02/12991 A1 | | 2/2002 | |

OTHER PUBLICATIONS

Japanese Office Action "Notification of Reasons for Refusal" dated May 6, 2010; Japanese Patent Application No. 2009-177069 with translation.
Japanese Office Action "Official Decision of Refusal" dated Oct. 18, 2010; Japanese Patent Application No. 2009-177069 with translation.
Japanese Office Action "Interrogation" dated Oct. 4, 2011; Appeal No. Appeal 2011-1786 Japanese Patent Application No. 2009-177069 with translation.
The extended European Search Report dated Dec. 18, 2012, which corresponds to EP Application No. 10804123.7-2224 / 2461236 PCT/JP2010004801 and is related to U.S. Appl. No. 13/387,712.
Japanese Office Action "Notification of Reason for Refusal" dated Jan. 22, 2013, which corresponds to JP Application No. 2010-288806 and is related to U.S. Appl. No. 13/387,712 with translation.
Japanese Office Action "Notification of Reason for Refusal" dated Jan. 17, 2012; Japanese Patent Application No. 2009-177069; Appeal No. 2011-1786; with translation.
An Office Action; "Decision of Refusal," issued by the Japanese Patent Office dated Jul. 30, 2013, which corresponds to Japanese Patent Application No. 2010-288806 and is related to U.S. Appl. No. 13/387,712; with Concise Explanation.
The Korean Office Action "Notice of Grounds for Rejection" dated May 13, 2013, which corresponds to Korean Patent Application No. 10-2012-7002480 and is related to U.S. Appl. No. 13/387,712 with translation.
International Search Report; PCT/JP2010/004801; dated Nov. 2, 2010.
The Taiwanese Office Action dated Oct. 28, 2013, which corresponds to Taiwanese Patent Application No. 100120408 and is related to U.S. Appl. No. 13/807,661; with English language concise explanation.
"Notification of the first Office Action" issued by the State Intellectual Property Office of China dated Dec. 26, 2013, which corresponds to Chinese Patent Application No. 201080033886.X and is related to U.S. Appl. No. 13/387,712; with English language translation.
An Office Action issued by the Korean Patent Office dated Oct. 31, 2013, which corresponds to Korean Patent Application No. 2012-7002480 and is related to U.S. Appl. No. 13/387,712.
An Office Action; "Notice of Reason for Rejection," issued by the Japanese Patent Office dated Oct. 1, 2013, which corresponds to Japanese Patent Application No. 2010-149641 and is related to U.S. Appl. No. 13/387,712; with concise explanation.
An Office Action; "Communication pursuant to Article 94(3) EPC," issued by the European Patent Office dated Jun. 18, 2014, which corresponds to European Patent Application No. 10 804 123.7-1954 and is related to U.S. Appl. No. 13/387,712.
"Notification of the Second Office Action," issued by the State Intellectual Property Office of China dated Aug. 15, 2014, which corresponds to Chinese Patent Application No. 201080033886.X and is related to U.S. Appl. No. 13/387,712; with English language translation.
An Office Action; "Decision of Rejection," issued by the Japanese Patent Office dated May 7, 2014, which corresponds to Japanese Patent Application No. 2010-149641 and is related to U.S. Appl. No. 13/387,712; with English language concise explanation.
An Office Action issued by the U.S. Patent Office dated Mar. 22, 2017, which corresponds to U.S. Appl. No. 13/807,661 and is related to U.S. Appl. No. 13/387,712.
TW Office Action dated May 10, 2017, from corresponding TW Appl No. 100120408, with English statement of relevance, 4 pp.
An Office Action issued by the U.S. Patent Office dated Dec. 28, 2017, which corresponds to U.S. Appl. No. 13/807,661 and is related to U.S. Appl. No. 13/387,712.

* cited by examiner

FIG. 6
(a)
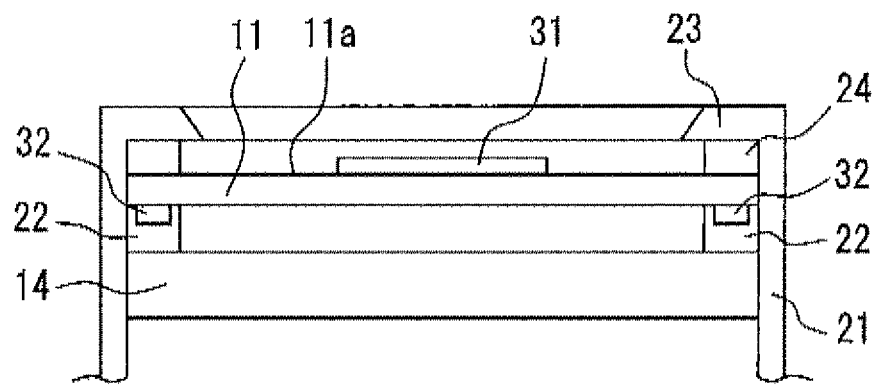
(b)
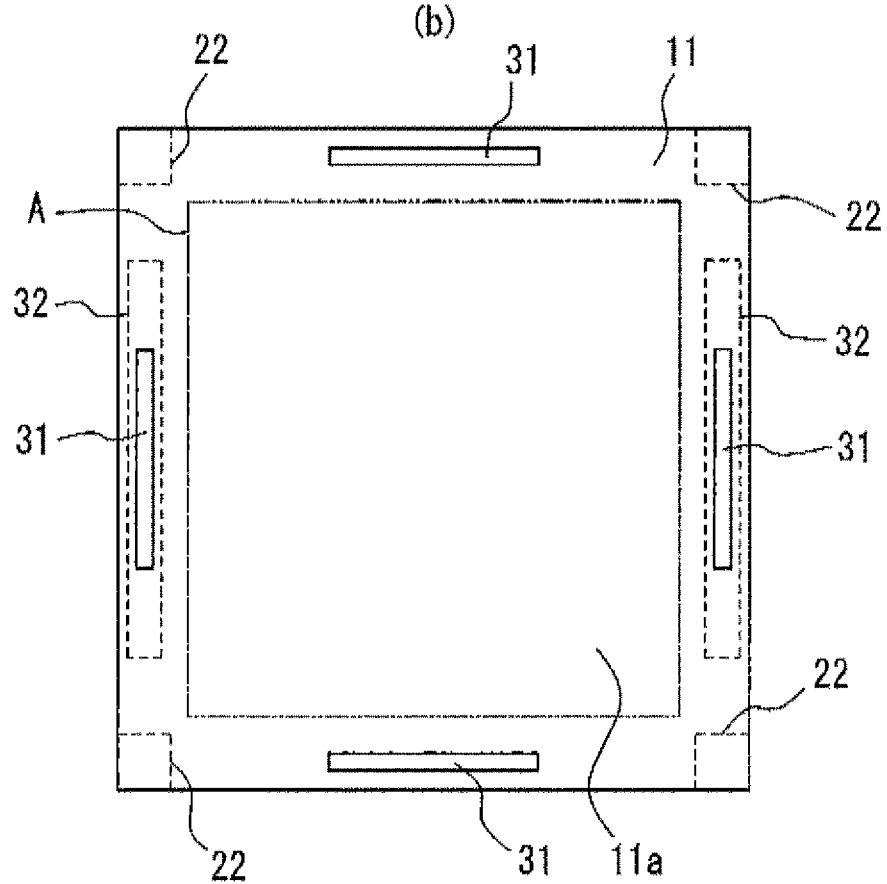

INPUT APPARATUS AND CONTROL METHOD FOR INPUT APPARATUS

CROSS REFERENCE TO RELATED APPLICATIONS

This application claims priority to and the benefit of Japanese Patent Application No. 2009-177069 filed on Jul. 29, 2009 and Japanese Patent Application No. 2010-149641 filed on Jun. 30, 2010, the entire contents of which are incorporated herein by reference.

TECHNICAL FIELD

The present invention relates to an input apparatus (tactile sensation providing apparatus) having a touch sensor and a control method of an input apparatuses.

BACKGROUND ART

In recent years, input apparatuses having touch sensors such as touch panels, touch switches or the like are popularly used as input apparatuses such as operation units, switches and the like for receiving input operations by a user in mobile terminals such as mobile phones, information equipments such as calculator, ticket vending machines, home electric appliances such as microwaves, TV sets, lighting equipments, industrial equipments (FA equipments) and the like.

There are known a variety of types of those touch sensors, such as a resistive film type, a capacitive type, an optical type and the like. However, touch sensors of any of these types receive a touch input by a finger or a stylus pen and, unlike push-button switches, the touch sensors themselves are not physically displaced even when being touched.

Since the touch sensors themselves are not physically displaced when touched, an operator cannot obtain feedback to an input even though the touch input is received. As a result, the operator is likely to input erroneously by touching the same spot multiple times, which may be stressful for the operator.

As methods to prevent such erroneous inputs, there are known methods for visually or auditory confirming the input operations by, for example, generating sounds or by changing a display state, such as colors of input objects such as input buttons and the like graphically depicted in a display unit, according to a pushed area upon reception of the touch input.

However, such auditory feedback may be difficult to be confirmed in a noisy environment and is not applicable when the equipment being used is in a silent mode. Or, in using such visual feedback, if the input object displayed on the display unit is small, the operator may not be able to confirm the change in the display state, as a view of the input object is blocked by a finger, particularly when the operator is inputting by the finger.

There is also suggested a feedback method relying on neither the auditory- nor visual sensation but instead generating a tactile sensation at operator's fingertip by vibrating the touch sensor when the touch sensor receives an input (for example, see Patent Documents 1, 2).

RELATED ART DOCUMENTS

Patent Documents

Patent Document 1: Japanese Patent Laid-Open No. 2003-288158
Patent Document 2: Japanese Patent Laid-Open No. 2008-130055

SUMMARY OF INVENTION

Technical Problem

The techniques disclosed in the above Patent Documents 1 and 2, however, merely generate the tactile sensation at the operator's fingertip by vibration. That is, they provide a mere "throbbing" sensation at the operator's fingertip touching a touch face by vibrating the touch sensor.

These apparatuses have button switches such as, for example, push-button switches (push-type button switches) graphically depicted on the touch sensor and provide the "throbbing" sensation, although the operator operates (pushes) the push-button switches (push-type button switches) with an intending for pushing them.

Therefore, although the operator pushes (operate with the intention of pushing) the push-type button switches, the operator will not be able to feel a button depression sensation obtained when the push-type button switches are pushed, and thus has a feeling of strangeness. It is to be noted that in this application the "button depression sensation" is referred to as a "click sensation" unless otherwise specified.

As a result, especially if the button switches such as the push-button switches (push-type button. switches) are graphically depicted on the touch sensor and a threshold for receiving an input to the touch sensor is low, a tactile sensation is provided when a finger and the like lightly touches the touch sensor. Thereby, it may cause erroneous operations in response to an unintended action (touch) before the operator pushes or it may inflict the feeling of strangeness on the operator upon the untended action (touch) before the operator pushes. Here, the threshold for the touch sensor to receive an touch input is a threshold at which the touch sensor responds, which is a threshold of a pressure at which an upper conductive film is contacted to a lower conductive film for the touch sensor of the resistive film type, or a threshold for detecting an electric signal by contact for the touch sensor of the capacitive type.

Accordingly, an object of the present invention in consideration of such conditions is to provide an input apparatus capable of providing the realistic click sensation, similar to that obtained when the push-button switch is operated, when an operator operates the touch sensor, and a control method for the input apparatus.

Solution to Problem

In order to achieve the above object, an input apparatus according to a first aspect of the present invention includes:
a touch sensor configured to receive an input;
a load detection unit configured to detect a pressure load on a touch face of the touch sensor;
a tactile sensation providing unit configured to vibrate the touch face; and
a control unit configured to control drive of the tactile sensation providing unit, when the pressure load detected by the load detection unit satisfies a standard to provide the tactile sensation, such that a click sensation is provided to an object pressing the touch face.

In addition, according to a second aspect of the present invention, in order to achieve the above object, a control method for an input apparatus including a touch sensor configured to receive an input;
a load detection unit configured to detect a pressure load on
a touch face of the touch sensor; and
a tactile sensation providing unit for vibrating the touch face,
includes a step of
controlling drive of the tactile sensation providing unit,
when the pressure load detected by the load detection unit
satisfies a standard to provide the tactile sensation, such that
a click sensation is provided to an object pressing the touch
face.

Moreover, in order to achieve the above object, an input apparatus according to a third aspect of the present invention includes:
a touch sensor configured to receive an input;
a load detection unit configured to detect a pressure load on a touch face of the touch sensor;
a tactile sensation providing unit configured to vibrate the touch face; and
a control unit configured to vibrate with one rive signal the tactile sensation providing unit, when the pressure load detected by the load detection unit satisfies a standard to provide a tactile sensation, such that a button depression sensation is provided to an object pressing the touch face.

Further, according to a fourth aspect of the present invention, in order to achieve the above object, a control method of an input apparatus including
a touch sensor configured to receive an input;
a load detection unit configured to detect a pressure load on
a touch face of the touch sensor; and
a tactile sensation providing unit configured to vibrate the
touch face, includes a step of:
vibrating the tactile sensation providing unit with one drive signal, when the pressure load detected by the load detection unit satisfies a standard to provide the tactile sensation, such that a button depression sensation is provided to an object pressing the touch face.

In order to achieve the above object, a tactile sensation providing apparatus according to a fifth aspect of the present invention includes:
a touch sensor configured to receive an input;
a load detection unit configured to detect a pressure load on a touch face of the touch sensor;
a tactile sensation providing unit configured to vibrate the touch face;
a memory unit configured to store drive signal information of the tactile sensation providing unit; and
a control unit configured to read out the drive signal information from the memory unit, when the pressure load detected by the load detection unit satisfies a standard to provide a tactile sensation, and to control drive of the tactile sensation providing unit based on the drive signal information, such that a button depression sensation is provided once to an object pressing the touch face.

Moreover, according to a sixth aspect of the present invention, in order to achieve the above object, a control method of a tactile sensation providing apparatus including
a touch sensor configured to receive an input;
a load detection unit configured to detect a pressure load on
a touch face of the touch sensor;
a tactile sensation providing unit configured to vibrate the
touch face; and
a memory unit configured to store drive signal information
of the tactile sensation providing unit, and includes a step
of:
reading out the drive signal information from the memory unit, then the pressure load detected by the load detection unit satisfies a standard to provide a tactile sensation, and controlling drive of the tactile sensation providing unit based on the drive signal information, such that a button depression sensation is provided once to an object pressing the touch face.

Effect of the Invention

According to the present invention, if the pressure load on the touch sensor satisfies the standard to provide the tactile sensation, the touch face of the touch sensor vibrates, so that a realistic click sensation, similar to that obtained when a push-button switch is operated, is provided to an operator.

BRIEF DESCRIPTION OF DRAWINGS

FIG. 6 illustrates an exemplary housing structure of the input apparatus illustrated in FIG. 5;

DESCRIPTION OF EMBODIMENT

Prior to descriptions of embodiments of the present invention, a description of a method for providing a click sensation applied to an input apparatus (tactile sensation providing apparatus) according to the present invention is provided.

The method for providing the click sensation described below was observed by a joint research by members including inventors of the present invention. An applicant of the present invention has already suggested an input apparatus based on the method (for example, see Japanese Patent Application No. 2008-326281).

For tactile sensory awareness, a human has a nerve responsible for a pressure sensation to feel a tactile sensation, such as hardness or softness of an object, from a load introduced to a bone and a muscle when touching the object and another nerve responsible for a tactile sensation to feel a texture of the object and the like by detecting a vibration introduced to a skin surface when touching the object. That is, the pressure sensation detects the load, whereas the tactile sensation detects the vibration. Then, a tactile sensation is generally a combination of the pressure sensation and the tactile sensation. Accordingly, reproduction of a stimulus, similar to the stimulus to the "pressure sensation" and the "tactile sensation" when operating a push-button switch, on a touch face of a touch sensor enables to provide a button depression sensation, namely, the click sensation to an operator.

On the other hand, metal dome switches, emboss switches, rubber switches, tactile switches and the like, for example, are widely known as the push-button switches used for information equipments and home electric appliances. Although there are differences in the stroke of a push-button and the applied load (pressing force) according to types of the switches, those general push-button switches basically have load characteristics as illustrated in FIG. 1.

Figure 1:
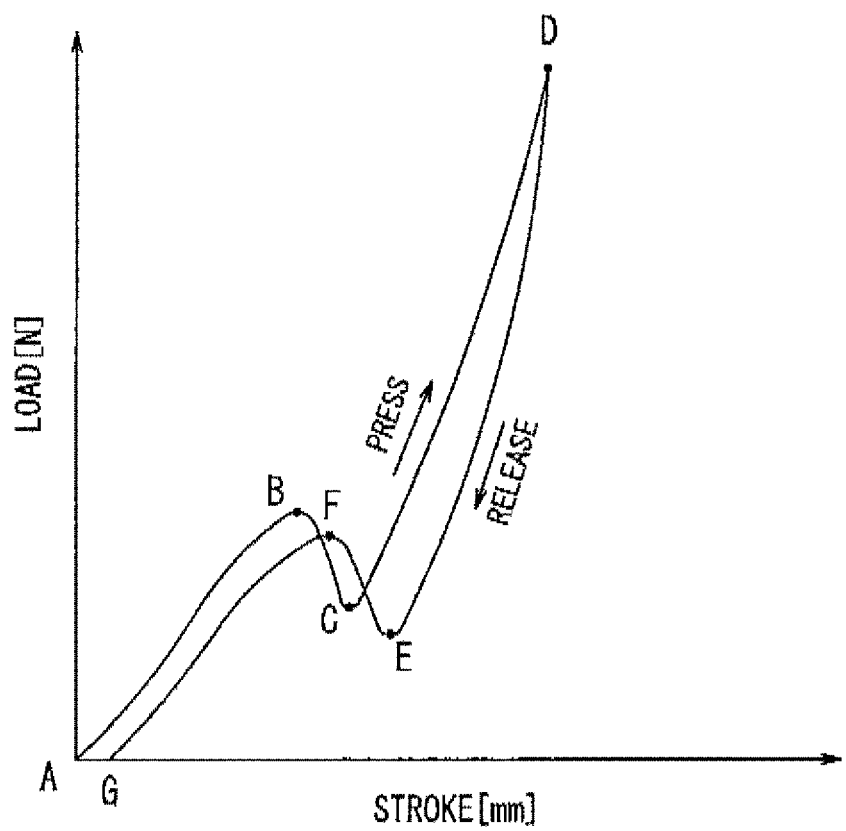
FIG. 1 is a diagram illustrating a general load characteristic of a push-button switch.

In the load characteristics in pressing in FIG. 1, a period from a point A to a point B represents a period in which a load increases in substantially proportion to pressing down from a start in pressing the push button. A period from the point B to a point C represents a period in which a convex elastic member such as the metal dome is buckled since the push button is pressed down, and thus the load is rapidly decreased. A period from the point C to a point D represents a period in which a contact point of the switch closes and the load increases in substantially proportion to pressing down.

Although there is a hysteresis to some degrees, the load characteristics of the push button in releasing retrace a change of the load in pressing. That is, a period from the point D to a point E represents a period in which the load decreases in substantially promotion to release from a start thereof and the contact point of the switch maintains a closed state. A period from the point E to a point F represents a period in which the elastic member recovers in a convex form from a buckled form by release of the push button and the load rapidly increases, and at start of this period the contact point of the switch is open. A period from the point F to a point G represents a period in which a finger is released from the push button after recovery of the elastic member and the load decreases in substantially proportion to the release.

In the load characteristics illustrated in FIG. 1, a maximum stroke of the push button is minimal; equal to or less than 1 mm for the metal dome switch, the emboss switch and the tactile switch and equal to or less than 3 mm for the rubber switch, for example. In addition, loads at the point B are around 1 N to 6 N, for example, on the metal dome switch, the emboss switch and the tactile switch and around 0.5 N, for example, on the rubber switch. The operator can feel the click sensation when operating any of those push-button switches.

As such, the researchers studied what kind of movement of the push-button switch provides the click sensation created by the "pressure sensation" and the "tactile sensation". First, it is studied which causes the click sensation, change in the stroke or change in the pressure load.

Figure 2:
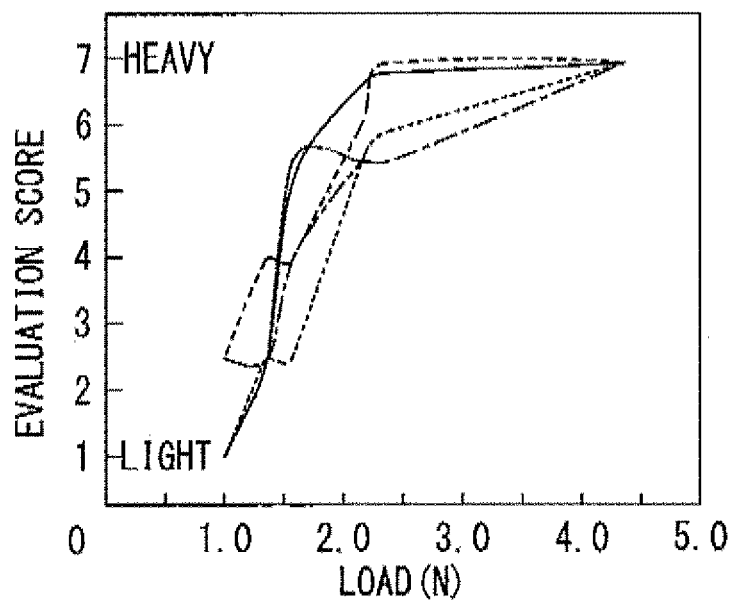
FIG. 2 is a diagram illustrating results of sensory evaluations on operations of a variety of push-button switches with different pressure loads.

FIG. 2 is a diagram illustrating results of sensory evaluations on how the operator felt when operating a variety of push-button switches with different pressure loads. A horizontal axis represents an actual pressure load and a vertical axis represents how operators felt about the push-button switches, heavy or light, on a scale of 1 to 7. Subjects as the operators were five people who were accustomed to use of mobile terminals. As illustrated in FIG. 2, they could percept that push-button switches with high pressure loads were heavy and push-button switches with low pressure loads were light.

Figure 3:
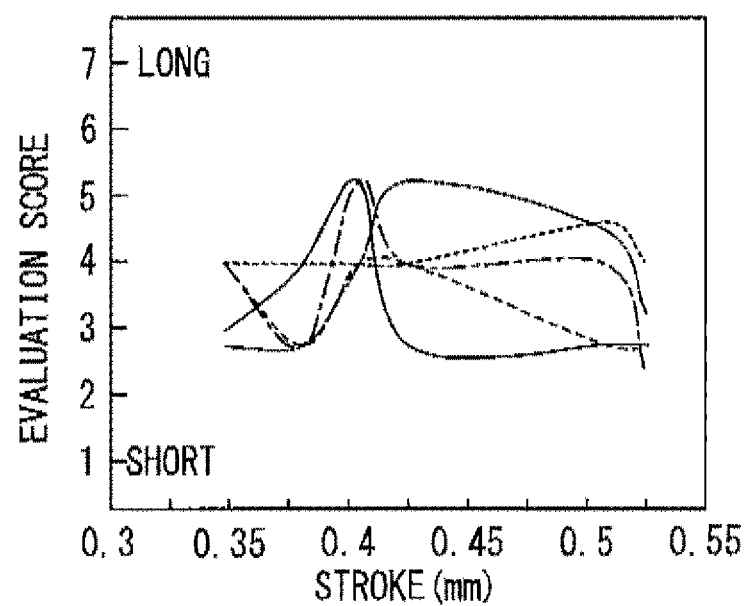
FIG. 3 is a diagram illustrating results of sensory evaluations on operations of a variety of push-button switches with different strokes.

FIG. 3 is a diagram illustrating results of sensory evaluations on how the operators felt when operating a variety of push-button switches with different strokes. A horizontal axis represents actual strokes and a vertical axis represents how the operators felt about the push-button switches, long or short, on a scale of 1 to 7. Subjects as the operators were the same five people as those in FIG. 2, who were accustomed to use of mobile terminals. As illustrated in FIG. 3, they could not clearly percept whether a minimal stroke was long or short.

The results of sensory evaluations presented above indicates that the human can percept a difference in the load but not a difference in the minimal stroke.

Therefore, the researchers focused on a change in the pressure load. That is since the human cannot percept the difference in the stroke, it was studied whether the human can feel the click sensation if the pressure load on a plane such as the touch sensor, that is, a stimulus to the pressure sensation is changed following the points A, B and C in FIG. 1. For that purpose, an experimental apparatus having a plate displacable in a vertical direction was prepared. Then, the plate was pressed down from the point A to the point B as illustrated in FIG. 1 and, at a point when a load reached the load at the point B, the plate was instantaneously displaced downward slightly in order to reproduce the change in the load between the points B, C.

As a result, although a "sense of pressing" to "have pressed down" the push-button switch was obtained, the realistic click sensation which could be obtained when operating the metal dome switch, for example, was not obtained. That is, it was observed that there is another element, which cannot be cleared by a relationship between the stroke and the load, in order to obtain the realistic click sensation.

As such, the researchers next studied focusing not only on the "pressure sensation" but also the "tactile sensation", which is another sensibility. Accordingly, with a variety of mobile terminals having the input apparatus with the push-button switches of the metal dome switches mounted thereon, the researchers measured vibrations generated at push buttons when the push buttons were operated. As a result, it was observed that at a point when the pressure load reaches the point B in FIG. 1, that is, at a point when the metal dome starts being buckled, the push button vibrates at a frequency of approximately 100-200 Hz.

Figure 4:
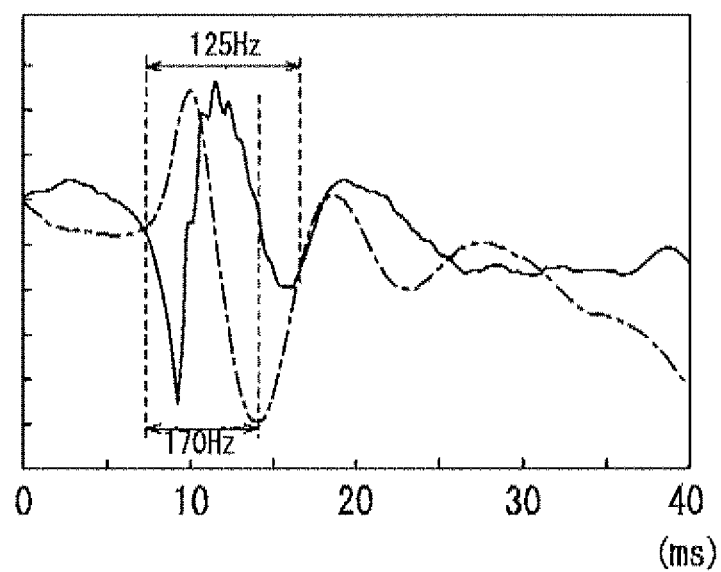
FIG. 4 is a diagram illustrating an exemplary result of a measurement of a vibration generated at a push button upon operation of the push-button switch.

FIG. 4 is a diagram illustrating an exemplary result of such measurement. A horizontal axis represents a pressure elapsed time, whereas a vertical axis represents vibration amplitude. This push-button switch vibrates as illustrated by a solid line in FIG. 4 at the point B in FIG. 1. Thereby, it was observed that the human receives 1 cycle of vibration stimulus of about 6 ms (a frequency of approximately 170 Hz) when pressing this push-button switch. In addition, at a point when the pressure load on the push-button switch reached the point F in FIG. 1 in releasing, that is, at a point when the metal dome recovered from the buckled state, this push button vibrated as illustrated by the dashed line in FIG. 4. Thereby, it was observed that in case of this push-button switch the human receives 1 cycle of the vibration stimulus of about 8 ms (a frequency of approximately 125 Hz) at release.

Accordingly, when the touch face in the form of a plate such as the touch sensor is pressed down, it is enabled to provide the click sensation, similar to that obtained when operating the push-button switch having the result of measurement as illustrated in FIG. 4, to the operator if the input apparatus stimulates the pressure sensation by letting the operator voluntarily press down the touch face without vibration when the load is from the point A to the point B illustrated in FIG. 1 and, at the point B, stimulates the tactile sensation by vibrating the touch face for 1 cycle at the frequency of 170 Hz or if the input apparatus stimulates the tactile sensation by providing a vibration waveform actually measured from the push-button switch to the operator.

Based on the above, when the touch face is pressed, the input apparatus according to the above suggestion by the applicant stimulates the pressure sensation until the pressure load satisfies a predetermined standard for receiving an input and, when the standard is satisfied, stimulates the tactile sensation by vibrating the touch face with a single predetermined drive signal, that is, with a frequency, cycle or drive time (wavelength), waveform and/or vibration amplitude, by the vibration unit. Thereby, the realistic click sensation similar to that obtained when the push-button switch is operated is provided to the operator.

Embodiments of the present invention based on the aforementioned method will be described with reference to the accompanying drawings.

The present invention provides the realistic sensation, similar to that obtained when the push-button switch is pushed down, to the operator of the touch sensor by detecting the pressure load separately from an operation of the touch sensor to receive an input and vibrating the touch sensor. That is, when the touch sensor is operated, the pressure load is detected separately from the operation of the touch sensor to receive an input and, if the pressure load on the touch face of the touch sensor satisfies a standard pressure load to provide the tactile sensation, the touch face is vibrated such that the realistic click sensation is provided to the operator without a feeling of strangeness.

(First Embodiment)

Figure 5:
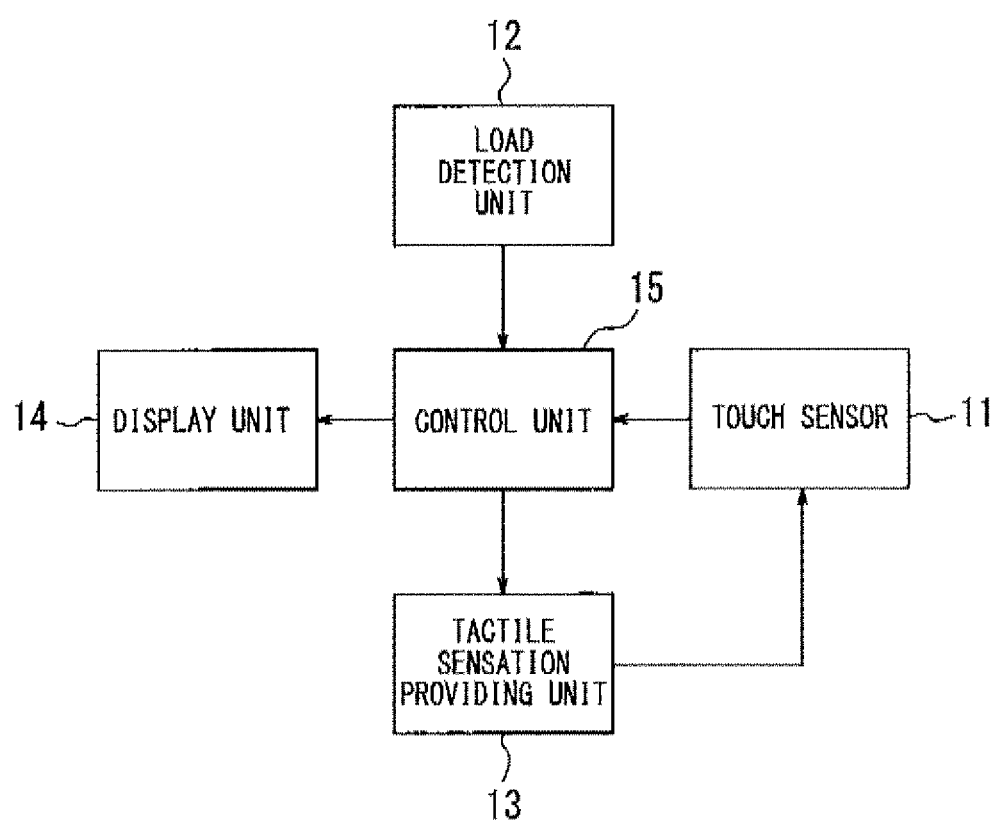
FIG. 5 is a block diagram illustrating a schematic constitution of an input apparatus according to a first embodiment of the present invention.

FIG. 5 is a block diagram illustrating a schematic constitution of an input apparatus according to a first embodiment of the present invention. This input apparatus has a touch sensor 11, a load detection unit 12, a tactile sensation providing unit 13, a display unit 14, and a control unit 15 for controlling overall operations. The touch sensor 11 receives an input to the display unit 14 by a finger and the like and may be, for example, of a known type such as a resistive film type, a capacitive type, an optical type and the like. The load detection unit 12 detects the pressure load applied to the touch face of the touch sensor 11 and may include an element such as, for example, a strain gauge sensor, a piezoelectric element or the like, which linearly reacts to a load. The tactile sensation providing unit 13 vibrates the touch sensor 11 and may include, for example, a piezoelectric vibrator. The display unit 14 displays an input object of an input button or the like such as the push-button switch (push-type button switch) and may be constituted of, for example, a liquid crystal display panel, an organic EL display panel or the like.

FIG. 6 illustrates an exemplary housing structure of the input apparatus illustrated in FIG. 5; FIG. 6(a) is a cross-sectional view of a main section and FIG. 6(b) is a plane view of the main section. The display unit 14 is contained in a housing 21. The touch sensor 11 is disposed on the display unit 14 via insulators 22 made of elastic members. In the input apparatus according to the present embodiment, the display unit 14 and the touch sensor 11 are rectangular in shape in a planar view and the touch sensor 11 is disposed on the display unit 14 via the insulators 22 arranged at four corners outside a display area A of the display unit 14 illustrated by a chain double-dashed line in FIG. 6(b).

In addition, the housing 21 is provided with an upper cover 23 covering a surface area of the touch sensor 11 outside the display area of the display unit 14. Insulator 24 made of elastic member is arranged between the upper cover 23 and the touch sensor 11.

The touch sensor 11 illustrated in FIG. 6 may have, for example, a surface member having a touch face 11a constituted of a transparent film or a glass and a rear face member constituted of the glass or acryl. The touch sensor 11 may be designed such that, when the touch face 11a is pressed down, a pushed part or a structure itself is bent (strained) slightly in accordance with the pressing force.

A strain gauge sensor 31 for detecting a load (pressuring force) applied on the touch sensor 11 is provided, adhered or the like, on a surface of the touch sensor 11 at a position close to each periphery covered by the upper cover 23. In addition, a piezoelectric vibrator 32 for vibrating the touch sensor 11 is provided, adhered or the like, on the rear face of the touch sensor 11 at a position close to a periphery on each of two opposing sides. That is, the input apparatus illustrated in FIG. 6 has the load detection unit 12 illustrated in FIG. 5 including four strain gauge sensors 31 and the tactile sensation providing unit 13 including two piezoelectric vibrators 32. In addition, the tactile sensation providing unit 13 vibrates the touch sensor 11 to vibrate the touch face 11a. It is to be noted that the housing 21, the upper cover 23 and the insulator 24 illustrated in FIG. 6(a) are omitted in FIG. 6(b).

Figure 7:
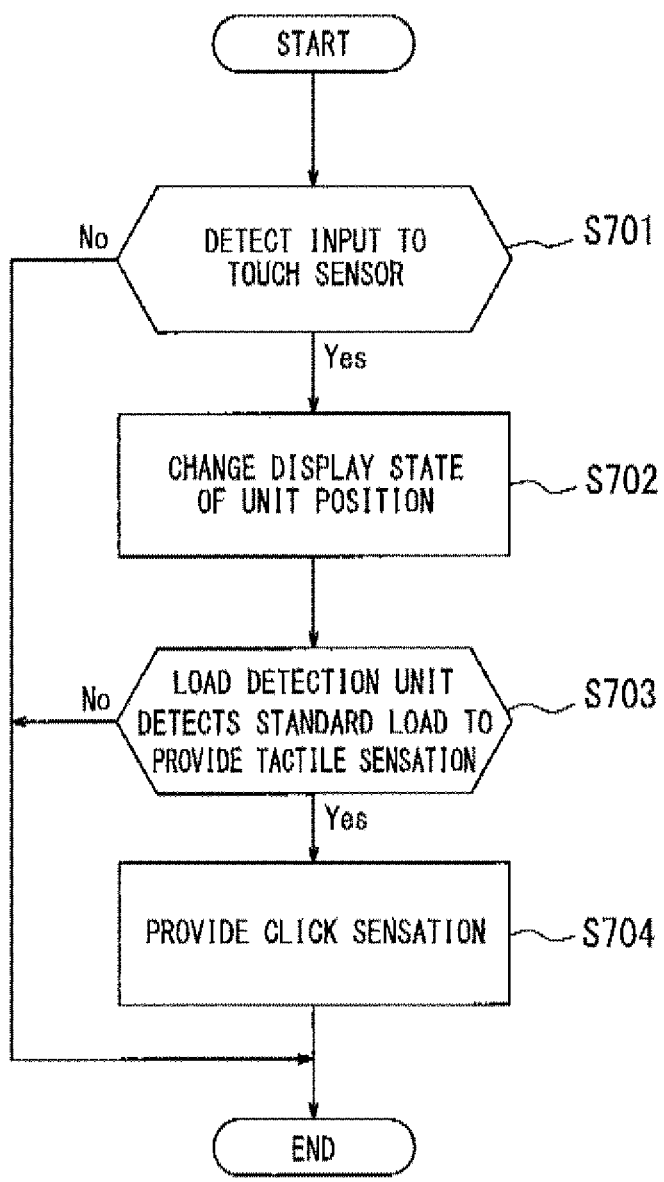
FIG. 7 is a flowchart of operations by the input apparatus illustrated in FIG. 5.

FIG. 7 is a flowchart of operations by the input apparatus according to the present embodiment. The control unit 15 monitors an input to the touch sensor 11 as well as monitoring a load detected by the load detection unit 12. The control unit 15 then detects whether the input to the touch sensor 11 by a pressing object (pressing means) such as a finger, a stylus pen and the like is an input to the input object displayed on the display unit 14 (step S701). As a result, if detecting that it is the input to the input object, the control unit 15 changes a display state of a portion (input portion) on the display unit 14 contacted by the pressing object (pressing means), by varying color or the like (step S702).

In addition, the control unit 15 also detects whether the pressure load detected by the load detection unit 12 increases with the pressure on the touch sensor 11 and satisfies the standard pressure load to provide the tactile sensation (step S703). If detecting that the pressure load satisfies the standard pressure load as a result, the control unit 15 drives the tactile sensation providing unit 13 once with the single predetermined drive signal. Thereby, the touch sensor 11 is vibrated in a predetermined vibration pattern, in order to provide the click sensation (step S704). It is to be noted that the load detection unit 12 detects the load from, for example, an average output value of the four strain gauge sensors 31. In addition, the tactile sensation providing unit 13 drives, for example, two piezoelectric vibrators 32 in phase.

Here, the standard pressure load to provide the tactile sensation detected at step S703 is, for example, the load at the point B illustrated in FIG. 1. Accordingly, the standard pressure load may be appropriately set in accordance with the load characteristic of an intended push-button switch in pressing. For example, a standard load pressure may be set to be equal to a load at which the touch sensor 11 responds (setting a timing to provide the tactile sensation to be the same as a timing of response by the touch sensor 11) or to be higher than the load at which the touch sensor 11 responds (setting the timing to provide the tactile sensation later than the timing of response by the touch sensor 11). Especially if it is applied to a mobile terminal, the standard pressure load may be set by a user as desired such that, in the load at which the touch sensor 11 responds or higher (the setting of the timing to provide the tactile sensation later than the timing of the response of the touch sensor 11), elder user may set it heavier (slower), whereas a user who often writes messages may set it lighter (quicker). Thereby, the click sensation is provided to the operator via the pressing object (pressing means) pressing the touch face 11a of the touch sensor 11, so that the operator can recognize that an input operation is completed.

In addition, the predetermined drive signal for driving the tactile sensation providing unit 13 at step S704, that is the certain frequency, the cycle (wavelength), the waveform and/or the vibration amplitude to stimulate the tactile sensation may be set appropriately according to the click sensation to be provided. For example, in order to provide the click sensation represented by the metal dome switch used for the mobile terminals, at the above point when the standard pressure load is applied, the tactile sensation providing unit 13 is driven by a drive signal, for example a sine wave with a frequency of 170 Hz, for 1 cycle so as to vibrate the touch face 11a by approximately 15 μm in a state of the standard pressure load being applied thereon. Thereby, it is possible to provide the realistic click sensation to the operator.

As set forth above, the input apparatus according to the present embodiment stimulates the pressure sensation until the load applied to the touch sensor 11 detected by the load detection unit 12 satisfies the standard to provide the tactile sensation and, when the standard is satisfied, stimulates the tactile sensation by driving the tactile sensation providing unit 13 with the single predetermined drive signal such that the touch face 11a is vibrated in a predetermined vibration pattern. Thereby, the input apparatus provides the click sensation to the operator such that the operator recognizes that the input operation is completed. Accordingly, even if the button switch such as the push-button switch (push-type button switch) is graphically depicted on the touch sensor, the operator can perform the input operation with feeling the realistic click sensation similar to that obtained when operating the push-button switch, thus the operator may not have the feeling of strangeness. Moreover, since the operator can perform the input operation in conjunction with perception to "have tapped" the touch sensor 11, erroneous input caused by mere tapping is prevented.

In addition, if the standard pressure load to provide the tactile sensation is set higher than the load at which the touch sensor 11 responds (setting the timing to provide the tactile sensation later than the timing of the response by the touch sensor 11), an input position is determined according to a touch operation to the touch face 11a, and the display state of the input object at a corresponding portion of the display unit 14 is changed. Then, when the pressure load on the touch face 11a detected by the load detection unit 12 satisfies the standard to provide the tactile sensation, the tactile sensation providing unit 13 is driven to provide the click sensation and the input position is confirmed to enable an execution of predetermined processing. In this case, the operator can confirm that the input object is selected, by seeing a change of the display state of the input object displayed on the display unit 14. Moreover, with the click sensation provided to the operator upon pressing the touch face 11a, the operator can recognize that the input object selected is determined. Thereby, erroneous input by a so-called wandering finger is prevented.

(Second Embodiment)

Figure 8:
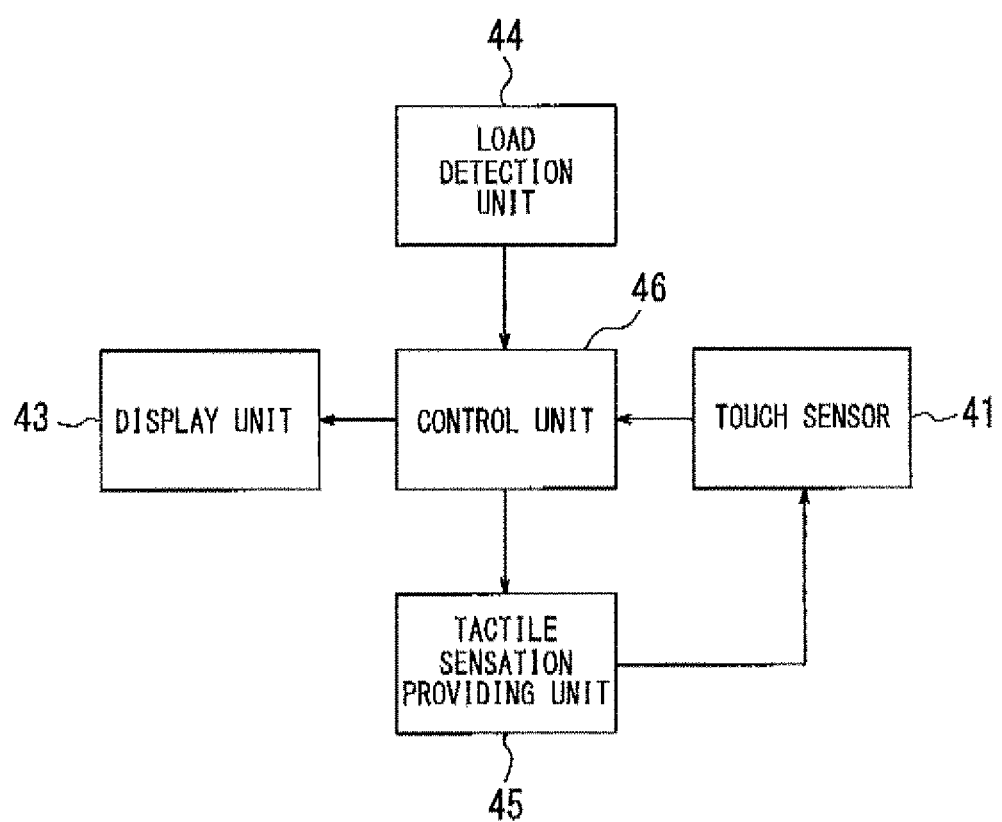
FIG. 8 is a block diagram illustrating a schematic constitution of an input apparatus according to a second embodiment of the present invention.
Figure 9:
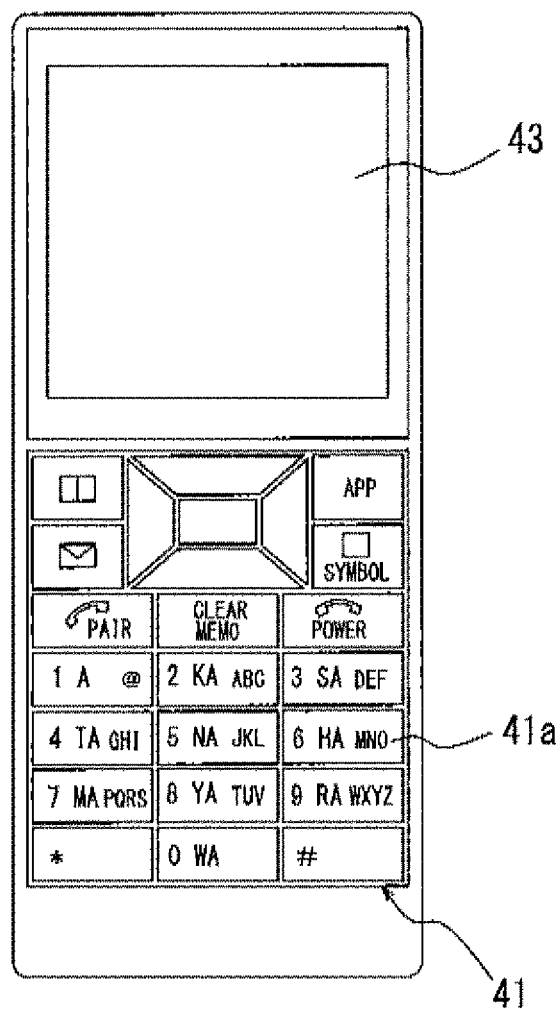
FIG. 9 is a front view of the input apparatus illustrated in FIG. 8.

FIG. 8 and FIG. 9 illustrate an input apparatus according to a second embodiment of the present invention; FIG. 8 is a block diagram of a schematic constitution and FIG. 9 is a front view. This input apparatus is mounted on, for example, the mobile terminal and, as illustrated in FIG. 8, has a touch sensor 41 for receiving an input, a display unit 43 for displaying information based on an input position on the touch sensor 41, a load detection unit 44 for detecting a pressure load on the touch sensor 41, a tactile sensation providing unit 45 for vibrating the touch sensor 41 and a control unit 46 for controlling overall operations.

As illustrated in FIG. 9, a plurality of input objects 41a such as numeric keys are already provided, printed, adhered or the like, on the touch sensor 41. Accordingly, in the input apparatus according to the present embodiment, each of the input objects 41a constitutes the touch face. In order to prevent an erroneous input pressing a plurality of adjacent input objects 41a, an effective pressing area of each input object 41a for receiving an input is set to be smaller than a disposition area of the input object 41a. It is to be noted that, in FIG. 8, the load detection unit 44 and the tactile sensation providing unit 45 are configured to have strain gauge sensors and piezoelectric vibrators, respectively, in the same manner as those of the input apparatus illustrated in FIG. 6.

The control unit 46 monitors an input to the touch sensor 41 and a load detected by the load detection unit 44. When a pressure load detected by the load detection unit 44 increases with the pressure on the touch sensor 41 and satisfies the standard to provide the tactile sensation, the control unit 46 drives the tactile sensation providing unit 45 with a predetermined drive signal to vibrate the touch sensor 41 in the predetermined vibration pattern in order to vibrate the touch face 11a.

That is, separately from a detection of an input to the effective pressing area of the input object by the touch sensor 41, the control unit 46 detects the pressure load and, in the same manner as that according to the first embodiment, drives the tactile sensation providing unit 45 with, for example, a cycle of the drive signal formed by a sine wave with a constant frequency of 170 Hz, when the load on the touch sensor 41 increases and satisfies the standard to provide the tactile sensation, such that the touch sensor 41 is vibrated by about 15 μm in a state of the predetermined load being applied thereon. Thereby, the click sensation is provided to the operator. In addition, by receiving the input detected on the touch sensor 41, the control unit 46 displays according to the input on the display unit 43.

Hence, if the standard pressure load to provide the tactile sensation is set to be a load at which the touch sensor 41 responds or higher, the operator, in the same manner as the first embodiment, can perform the input operation to the touch sensor 41 with feeling the realistic click sensation similar to that obtained when operating the push-button switch, thus the operator does not have the feeling of strangeness. Moreover, since the operator performs the input operation in conjunction with the perception to "have tapped" the touch sensor 41, the erroneous input caused by mere tapping is prevented.

Here, results of sensory evaluations on the click sensation conducted by the researchers stated above are described together with the research on the click sensation providing method described above. The sensory evaluations described below were conducted using the input apparatus previously suggested by the applicant described above.

Although there are deviations to some degrees according to models of terminals, the metal dome switches widely used for commercially available mobile terminals have the load characteristics that the load is rapidly decreased when a predetermined load, roughly equal to or less than 6 N and generally equal to or less than 3 N, is applied thereon. As such, the researchers conducted the sensory evaluations of the click sensation with a load of 1.5 N (load at the point B in FIG. 1) on the touch sensor for starting drive of a vibration unit (corresponding to the tactile sensation providing unit according to the present invention) and parameters such as the frequency, the cycle (wavelength) and the waveform of the drive signal.

Exemplary results of the evaluations are illustrated in FIG. 10 to FIG. 13. In FIG. 10 to FIG. 13, the subjects were the same five people as those involved in the sensory evaluations illustrated in FIG. 2 and FIG. 3. Three evaluation items were "feel click sensation", "good feeling" and tactile sensation "similar to mobile terminal". It is to be noted that "click sensation" of the item "feel click sensation" in FIG. 10 to FIG. 13 has meaning such as a sensation during a sequence of operation including pressing and releasing of the touch sensor. For the item "feel click sensation", "No" scores 1 and "Strongly feel" scores 7. For the item "good feeling", "Bad" scores 1 and "Good" scores 7. For the item "similar to mobile terminal", "not similar" scores 1 and "very similar" scores 7. The score of each item represents an average score of the five people.

Figure 10:
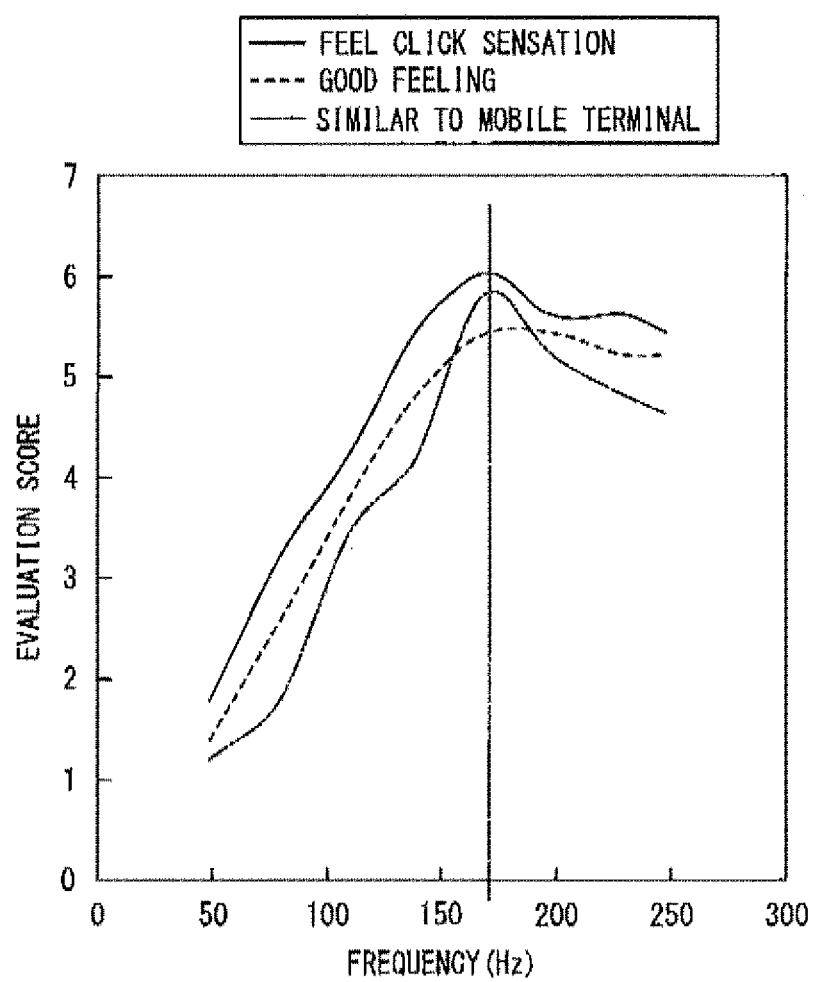
FIG. 10 is a diagram illustrating results of sensory evaluations on a click sensation when varying frequency for vibrating a touch sensor.

FIG. 10 illustrates results of evaluations when varying the frequency. In sensory evaluations with them, the cycle (wavelength) to drive the vibration unit, that is, the drive time was 1 cycle, the waveform was the sine wave, and the frequency was varied in a range of 50-250 Hz. The amplitude of the drive signal was set to be a level at which the vibration amplitude of 15 μm can be obtained in a state of a predetermined standard load being applied on the touch sensor. As illustrated in FIG. 10, it was observed that, although the highest evaluation was obtained at the frequency of 170 Hz, the human obtains the click sensation similar to that of the mobile terminals at a frequency of 140 Hz or higher.

Figure 11:
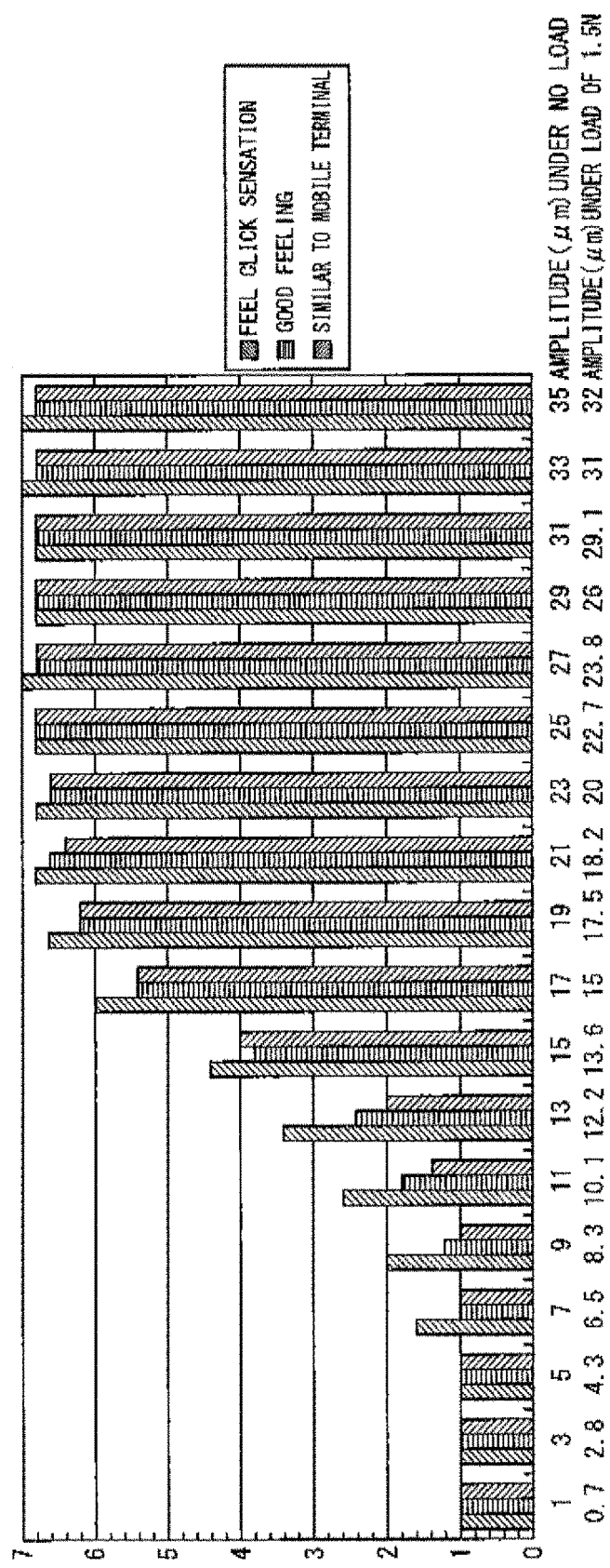
FIG. 11 is a diagram illustrating results of sensory evaluations on the click sensation when varying vibration amplitude of the touch sensor.

FIG. 11 illustrates results of evaluations when varying the amplitude of the drive signal. In the sensory evaluations, the frequency of the drive signal for driving the vibration unit was 170 Hz, the cycle was 1 cycle and the waveform was the sine wave. The signal amplitude was varied such that, in a state with no load in which the touch sensor was not pressed, the touch sensor is vibrated in predetermined amplitude in a range of 1-35 μm. Under a condition of the vibration amplitude with no load, the vibration unit was driven when a load of 1.5 N is applied on to the touch sensor in order to evaluate each item. A horizontal axis in FIG. 11 represents the vibration amplitude when the load of 1.5 N was applied corresponding to the vibration amplitude with no load on the touch sensor. As a result, as illustrated in FIG. 11, it was observed that, in a state with the load of 1.5 N, the human sufficiently obtains the click sensation if the vibration amplitude is 15 μm or more. That is, the human feels the click sensation if the touch sensor is vibrated with the vibration amplitude of 15 μm or more for 1 cycle at a frequency of 170 Hz in a state of the load of 1.5 N being applied on the touch sensor.

Figure 12:
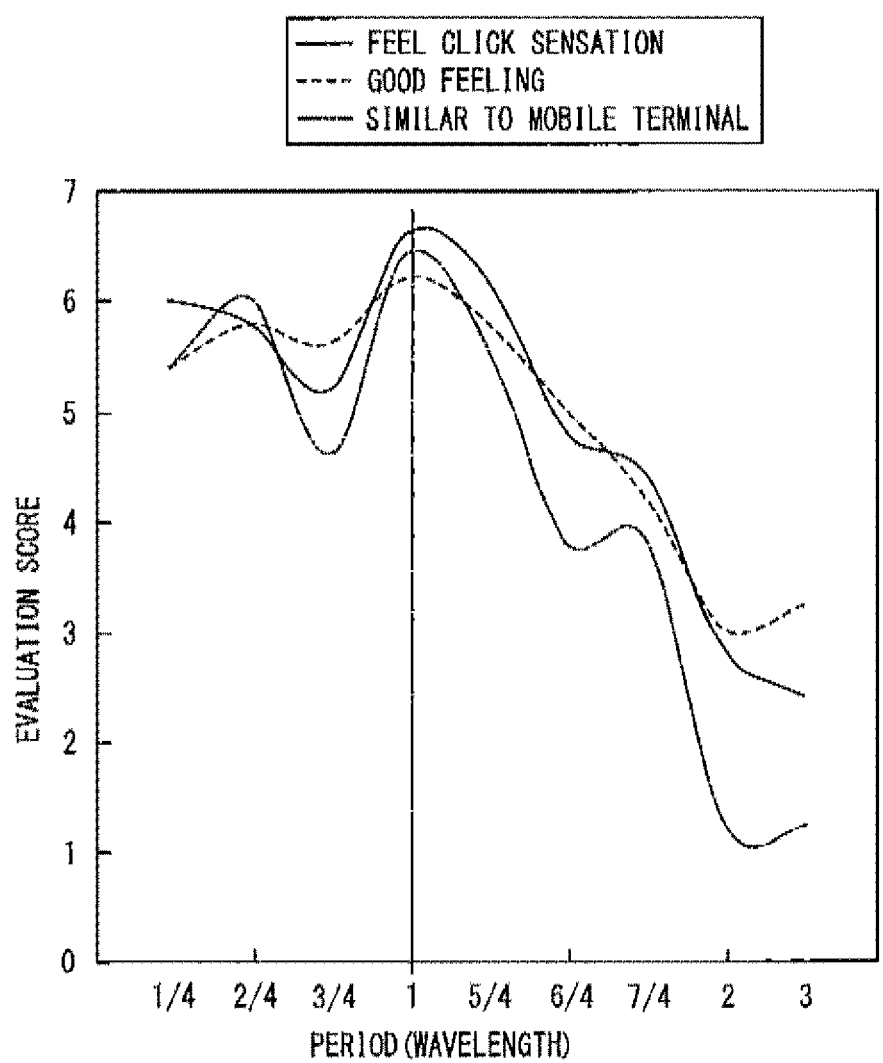
FIG. 12 is a diagram illustrating results of sensory evaluations on the click sensation when varying the cycle of a drive signal for vibrating the touch sensor.

FIG. 12 illustrates results of evaluations when varying the cycle (wavelengths), that is, drive time. In the sensory evaluations, the waveform of the drive signal for driving the vibration unit was the sine wave, the signal amplitude was set to obtain the vibration amplitude of 15 μm in a state of the predetermined standard load being applied on the touch sensor, the frequency was 170 Hz, and the cycle was varied in a range of ¼ to 3 cycles. For ¼ cycle and ½ cycle, the signal amplitude was set such that a vibration displacement on the touch sensor was approximately the same as those in other cycles, that is, so as to obtain the vibration amplitude of approximately 15 μm. As a result, as illustrated in FIG. 12, the highest evaluation was obtained when the cycle (wavelength) was 1 cycle. In addition, it was also observed that, preferable results were basically obtained with ¼ cycles and less than 1 cycle, but in case of 3⁄2 or more cycles the tactile sensation differed from the click sensation of the mobile terminal.

Figure 13:
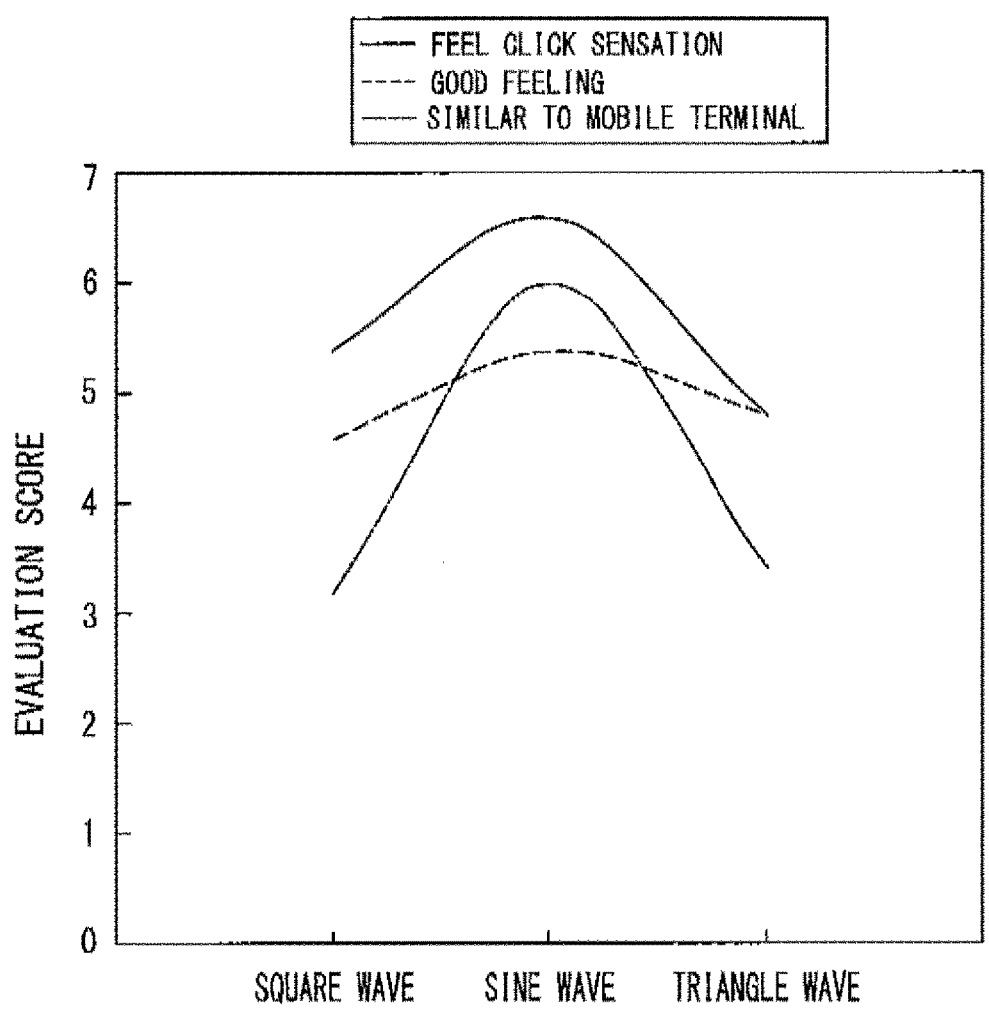
FIG. 13 is a diagram illustrating results of sensory evaluations on the click sensation when varying waveform of the drive signal for vibrating the touch sensor.

FIG. 13 illustrates results of evaluations when varying waveform of the drive signal. In the sensory evaluations, the sine wave, a square wave and a triangle wave were used as the waveform of the drive signal for driving the vibration unit. In addition, each signal has a frequency of 170 Hz, the signal amplitude was set to be a level which causes the vibration amplitude of 15 μm in the state of the predetermined standard load being applied to the touch sensor, and the cycle was 1 cycle. As a result, as illustrated in FIG. 13, the highest evaluation was obtained with the sine wave.

Figure 14:
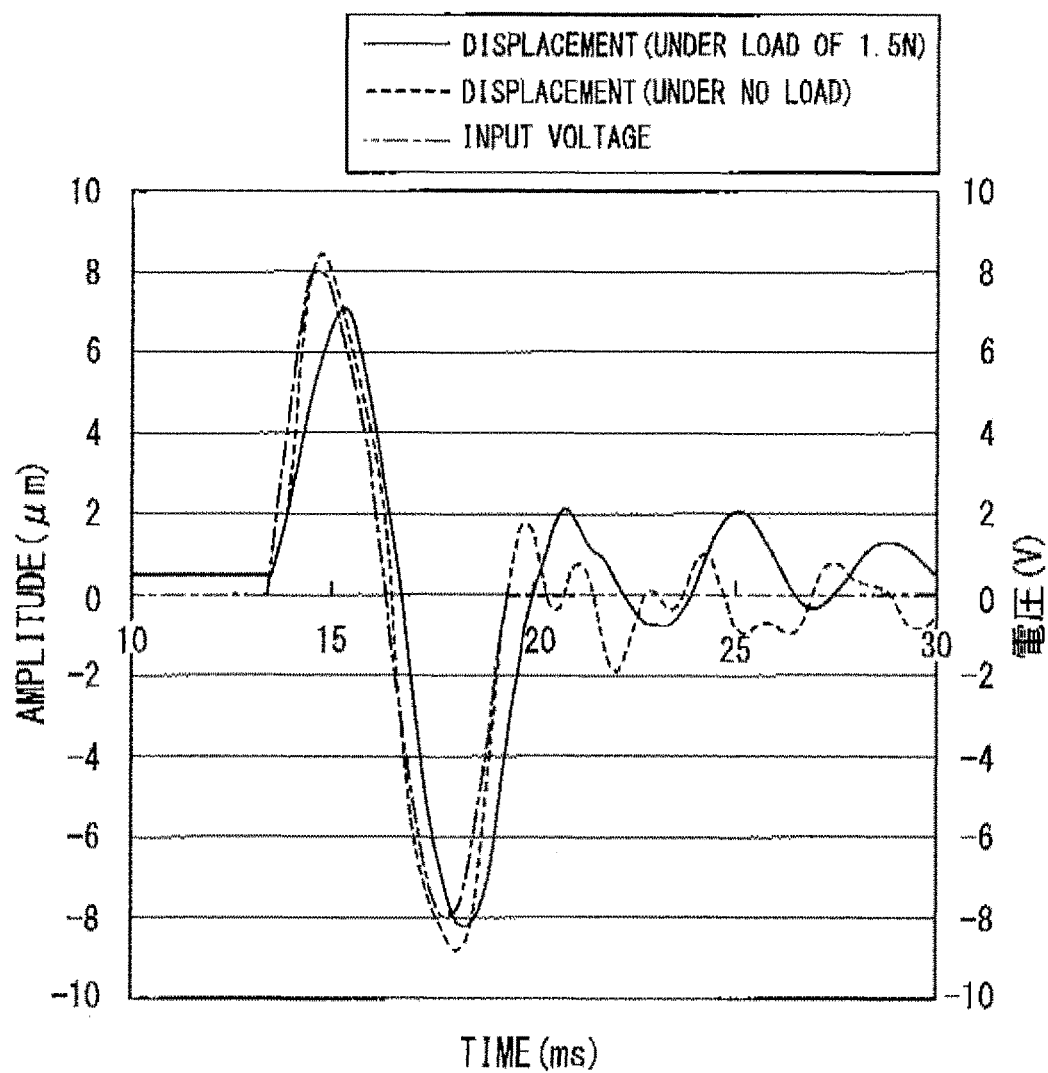
FIG. 14 is a diagram illustrating the waveform of the drive signal for vibrating the touch sensor and an actual waveform of the vibration amplitude of the touch sensor.

Here, the drive signal of the sine wave (input voltage of the drive unit), as illustrated by a dashed line in FIG. 14, may be the voltage of 1 cycle from any phase, not only 1 cycle in which the voltage increases from 0 degree phase and then decreases but also, such as, 1 cycle in which the voltage decreases from 180 degree phase and then increases. FIG. 14 also illustrates a waveform (broken line) of the vibration amplitude of the touch sensor under no load and a waveform (solid line) of the vibration amplitude of the touch sensor under a load of 1.5 N when the drive unit is driven by the input voltage illustrated by the dashed line.

From the exemplary results of the evaluations described above, it was confirmed that it is enabled to provide the realistic click sensation, which is the button depression sensation, to the operator, at a point when a load satisfying the predetermined standard is applied on the touch sensor, if the vibration unit is vibrated with a drive signal of, for example, 5/4 cycle or less, preferably 1 cycle of the sine wave with a frequency of 140 Hz or more, preferably 170 Hz, and amplitude to vibrate the vibration unit by approximately 15 μm or more.

The input apparatus according to each embodiment of the present invention drives the load detection unit 12 (44) based on the results of the sensory evaluations described above. That is, if the load detection unit 12 (44) detects the pressure load of 1.5 N, which is the standard to provide the tactile sensation, the tactile sensation providing unit 13 (45) is driven with the drive signal of, for example, 5/4 or less cycle, preferably 1 cycle of the sine wave with a frequency of 140 Hz or higher, preferably 170 Hz, and the amplitude to vibrate the touch sensor 11 (41) by approximately 15 μm or more. Thereby, it is possible to provide the realistic click sensation once to the operator.

(Third Embodiment)

When the human operates the push-button switch, the human is given a tactile stimulus at a finger by the push-button switch not only in pressing but also in releasing, as illustrated in FIG. 4. As such, an input apparatus according to a third embodiment of the present invention, using the input apparatus according to the first or the second embodiments, provides an operator with a click sensation in releasing as well (hereinafter, the click sensation in releasing is referred to as a release sensation, arbitrarily). Thereby, the operator is provided with a realistic click sensation more similar to that of the push-button switch. The following is a description of operations by the input apparatus according to the present embodiment, using the constitution illustrated in FIG. 5 and FIG. 6, by way of example.

Figure 15:
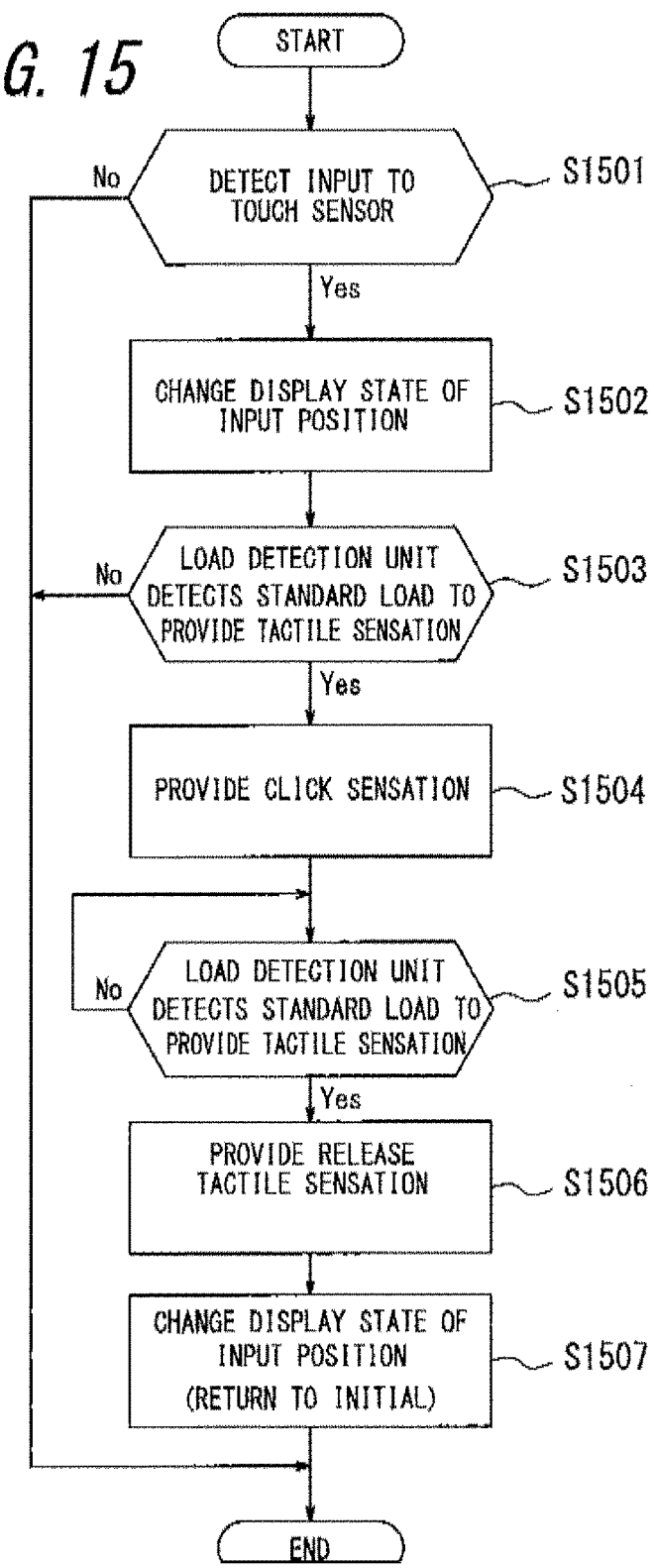
FIG. 15 is a flowchart of operations by an input apparatus according to a third embodiment of the present invention.

FIG. 15 is a flowchart of operations by the input apparatus according to the present embodiment. In FIG. 15, steps S1501 to S1504 are processing the same as those at steps S701 to S704 illustrated in FIG. 7. That is, as described with reference to FIG. 7, when detecting that the input to the touch sensor 11 is the input to the input object displayed on the display unit 14 (step S1501), the control unit 15 changes the display state of the portion (input portion) on the display unit 14 contacted by the pressing object (pressing means) by changing color and the like (step S1502).

In addition, when detecting that the pressure load detected by the load detection unit 12 increases with the pressure on the touch sensor 11 and satisfies the standard to provide the tactile sensation (step S1503), the control unit 15 drives the tactile sensation providing unit 13 once with the single predetermined drive signal. Thereby, the touch sensor 11 is vibrated in a predetermined vibration pattern (step S1504) in order to provide the click sensation once to the operator via the pressing object (pressing means) pressing the touch sensor 11. Here, in the same manner as the above embodiments, the standard pressure load to provide the click sensation is set to be a pressure load at which the touch sensor 11 responds, that is, detects the input, or higher.

Than, in resealing, when detecting that the load detected by the load detection unit 12 satisfies the standard to provide the tactile sensation (step S1505), the control unit 15, in the same manner as that in pressing, drives the tactile sensation providing unit 13 once with the single predetermined drive signal. Thereby, the touch sensor 11 is vibrated in a predetermined vibration pattern (step S1506) in order to provide the release sensation once to the operator via the pressing object (pressing means) pressing the touch sensor 11. In addition, substantially at the same time to drive the tactile sensation providing unit 13, the control unit 15 changes the display state of the portion (input portion) in the display unit 14 touched by the pressing object (pressing means) by returning to an initial state and the like (step S1507). Thereby, the operator recognizes that the input operation is completed.

Here, a standard load (second standard) to provide the tactile sensation in releasing at step S1505, that is, a standard load used for detection after the click sensation is provided in pressing may be set to be any load lower than a standard load in pressing (first standard) to provide the click sensation used for detection at step S1503. In addition, in releasing at step S1506, the drive signal for driving the tactile sensation providing unit 13 may be either the same as or different from that in pressing at step S1504. For example, the frequency of the drive signal in pressing when the touch sensor 11 detects the input may be at 170 Hz, while that in releasing may be at 125 Hz as illustrated in FIG. 4.

As described above, it is enabled to provide the release sensation corresponding to the click sensation, when the load detected by the load detection unit 12 satisfies the standard to provide the tactile sensation in releasing after the click sensation is provided in pressing, by driving the tactile sensation providing unit 13 with the single predetermined drive signal to vibrate the touch sensor 11 in the predetermined vibration pattern in the same manner as that in pressing. Accordingly, in combination with the click sensation in pressing, realistic click sensation more similar to that of the push-button switch is provided to the operator.

Figure 16:
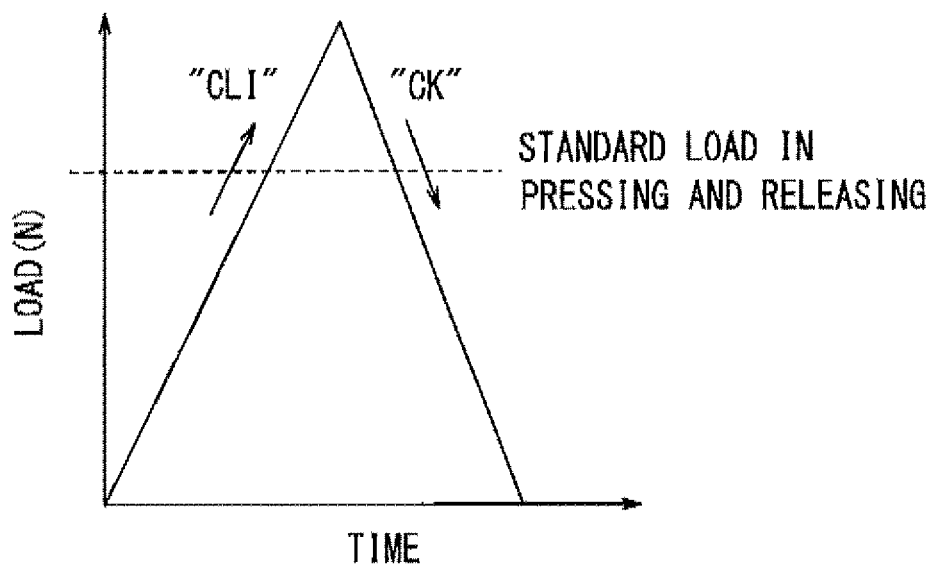
FIG. 16 is a diagram illustrating an example of click sensation provided by the input apparatus according to the third embodiment when a standard load in pressing to provide the tactile sensation and that in releasing to provide the tactile sensation are set to be equal.

For example, if the standard load in pressing for driving the tactile sensation presenting unit 13 and that in releasing are set to be equal, the click sensation and the release sensation in pressing and releasing, respectively, are provided as illustrated in FIG. 16 if a maximum load in pressing exceeds the standard load. Accordingly, it is possible to provide the click sensation more similar to that of the push-button switch to the operator. It is to be noted that, in FIG. 16 and other figures, "Cli" and "Ck" represent the click sensation the human feels.

Figure 17:
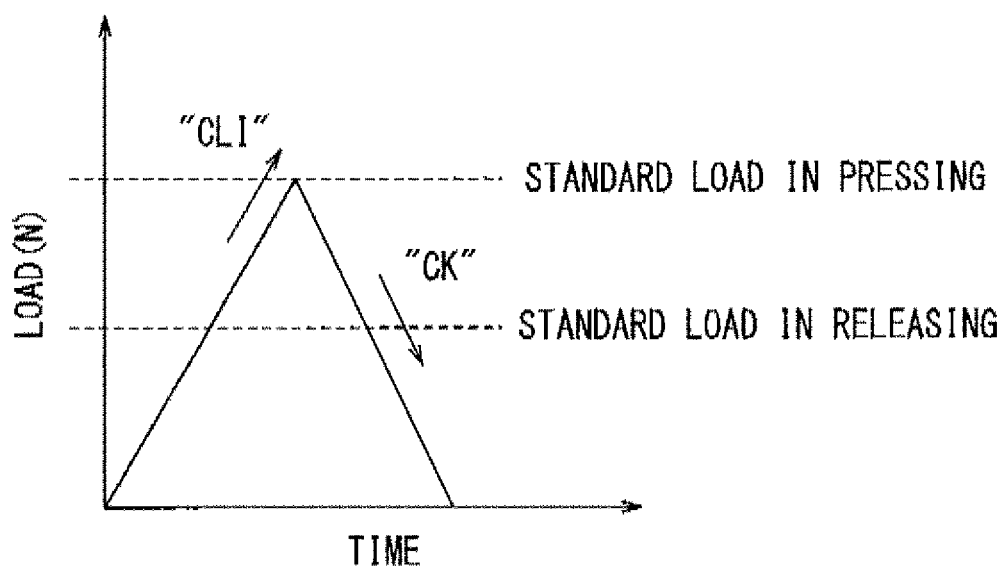
FIG. 17 is a diagram illustrating an example of click sensation provided by the input apparatus according to the third embodiment when the standard load in releasing to provide the tactile sensation is set to be less than that in pressing to provide the tactile sensation.

In a case where the standard load in releasing for driving the tactile sensation providing unit 13 is set to be any load lower than that in pressing, even if the maximum load in pressing is the standard load in pressing, that is, even if the pressing object (pressing means) is pulled back at the standard load in pressing, it is possible to provide the click sensation and the release sensation corresponding to the click sensation in pressing and releasing, respectively, as illustrated in FIG. 17. As illustrated in FIG. 16, in a case where the standard load in pressing for driving the tactile sensation providing unit 13 and that in releasing are set to be equal, if the maximum load in pressing coincides with the standard load, the tactile sensation providing unit 13 may not be driven in releasing or providing an unexpected release sensation when the operator intends to maintain the pressure load at the standard load, resulting in the feeling of strangeness to the operator. In contrast, if the standard load in releasing (second standard) for driving the tactile sensation providing unit 13 is set to be any load lower than that in pressing (first standard) as illustrated in FIG. 17, the release sensation in releasing is certainly provided and thus it is enabled to ensure to provide the click sensation more similar to that of the push-button switch to the operator.

Figure 18:
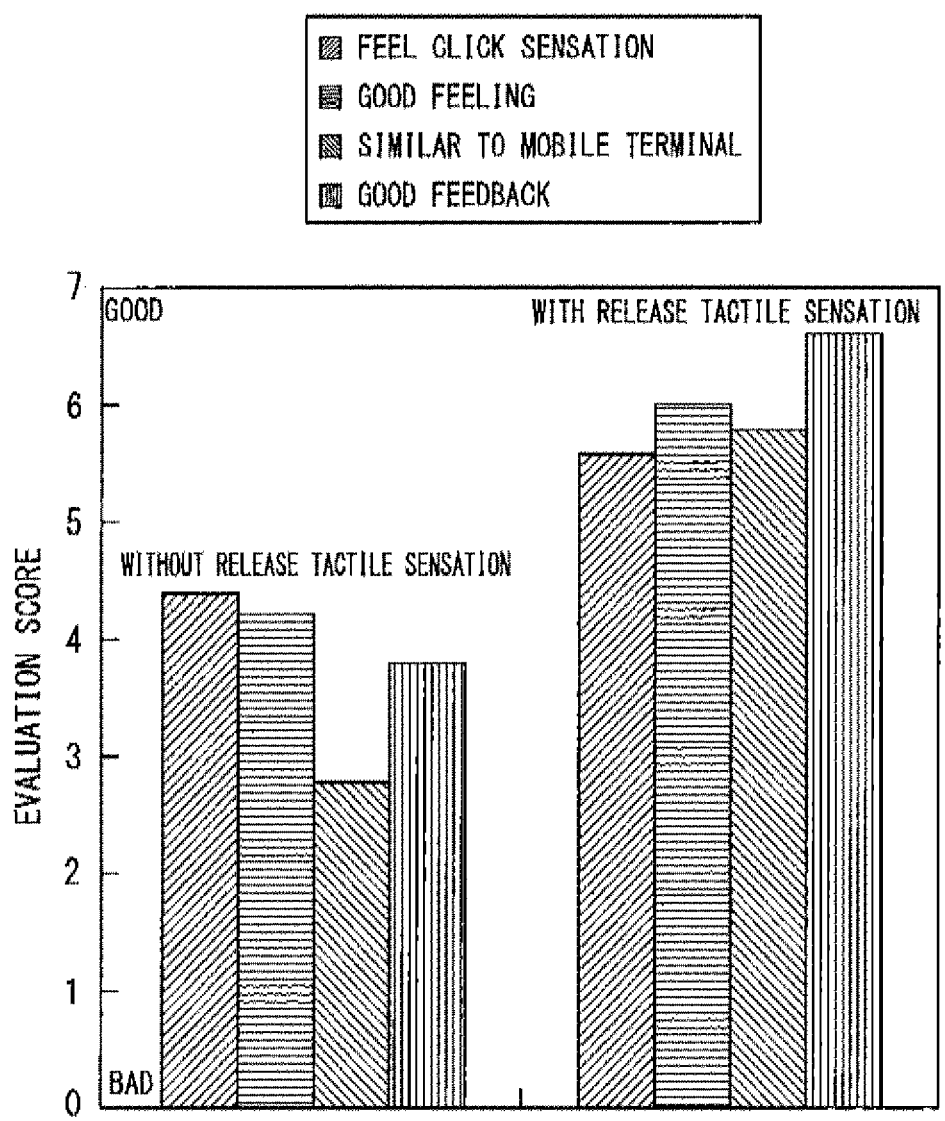
FIG. 18 is a diagram illustrating exemplary results of sensory evaluations on the click sensation comparing with and without the click sensation.

FIG. 18 illustrates results of sensory evaluations of a case when only the click sensation was provided in pressing, and a case when the click sensation was provided in pressing and the release sensation was provided in releasing. In the same manner as the sensory evaluations described above, these sensory evaluations were conducted using the input apparatus previously suggested by the applicant.

In FIG. 18, bars on the left side represent results of the evaluations when only the click sensation was provided in pressing, that is, "without the release sensation", whereas bars on the right side represent results of the evaluations when the click sensation was provided in pressing and the release sensation was provided in releasing, that is, "with the release sensation". The subjects were the same five people as those involved in the sensory evaluations illustrated in FIG. 2 and FIG. 3. Evaluation items were four items including "good feedback (easy to percept)" in addition to the three evaluation items in FIG. 10 to FIG. 13. Each item is on a scale of 1 to 7 and the score of each item represents an average score of the five people. For the item "good feedback", "bad" scores 1 and "good" scores 7. In addition, the standard load in pressing and that in releasing to provide the tactile sensation were set to be equal and the same drive signal is used in pressing and releasing. Here, the standard load to provide the tactile sensation was 1.5 N. In addition, the drive signal was 1 cycle of sine wave with the frequency of 170 Hz and the amplitude to vibrate the touch sensor by approximately 15 µm under the pressure of 1.5 N.

As illustrated in the results of the evaluations in FIG. 18, it was observed that, if the release sensation is provided by vibrating the touch sensor in releasing as well, the click sensation becomes more similar to that of the push-button switch of the mobile terminal and a good feedback (perception) is obtained.

(Fourth Embodiment)

Incidentally, the input apparatus used in the mobile terminals, for example, is often used for a so-called repetitive tap to continuously input the same input object in inputting a phone number, a message and the like. In such a case, if the touch sensor 11 is vibrated in the predetermined vibration pattern not only in pressing but also in releasing as illustrated in FIG. 18, it is necessary to appropriately set the predetermined standard load in releasing to provide the tactile sensation.

Figure 19:
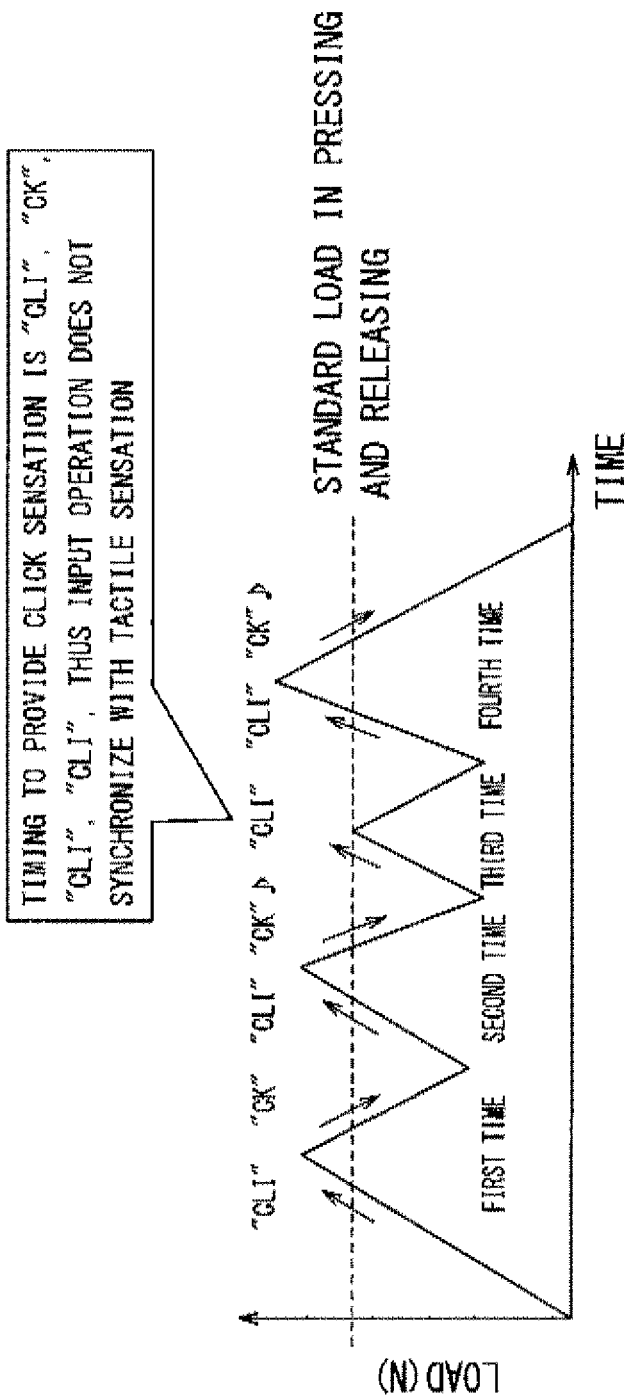
FIG. 19 is a diagram illustrating example of tactile sensations provided during continuous input when the standard load in pressing to provide the tactile sensation and that in releasing to provide the tactile sensation are set to be equal.

That is, when the human quickly performs continuous input, a next input is generally started before the pressure load returns to "0" and the maximum load in pressing varies. At this point, in a case where the standard load in pressing to provide the tactile sensation and that in releasing are set to be equal as described in the third embodiment, if the pressure load is pulled back at the standard load during continuous input as illustrated in FIG. 19, the tactile sensation providing unit 13 may not be driven in releasing of the input or the click sensation of a next input may be provided before the operator recognizes to have released. Accordingly, it is assumed that the tactile sensation is not matched with the input operation, thereby inflicting the feeling of strangeness on the operator. FIG. 19 illustrates a case where a pressure load on a third input in four continuous inputs is pulled back from the standard load.

Figure 20:
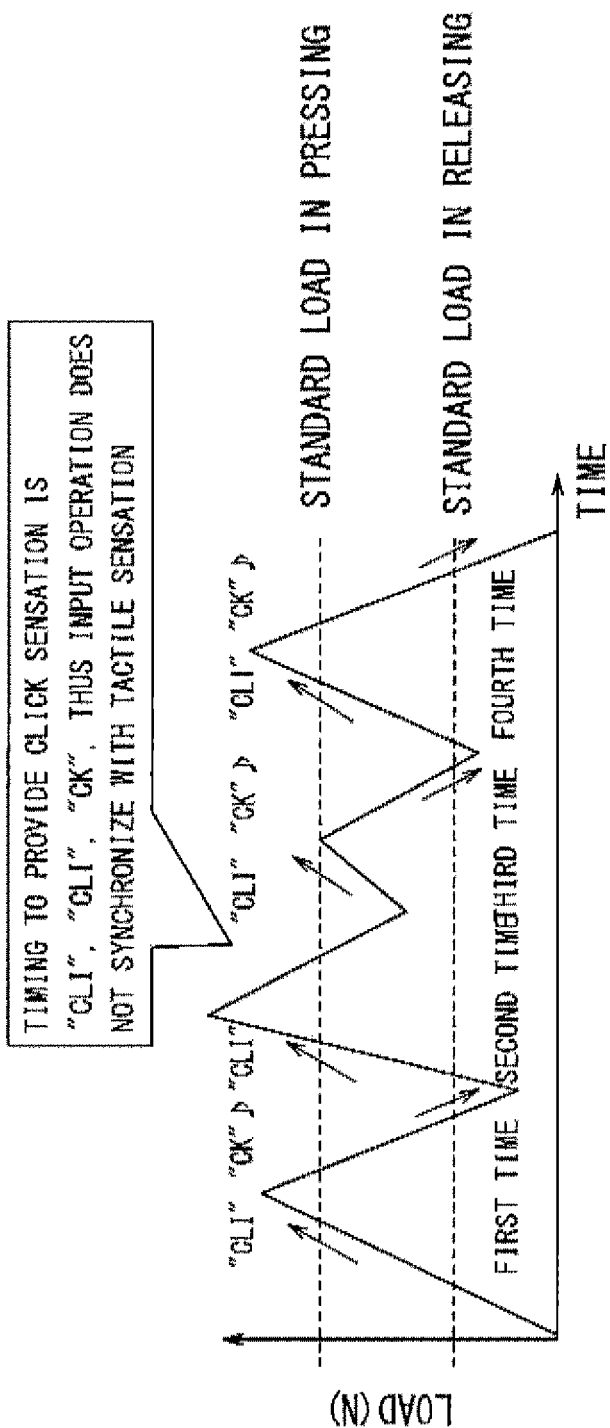
FIG. 20 is a diagram illustrating example of tactile sensations provided during continuous input when the standard load in releasing to provide the tactile sensation is set lower than that in pressing to provide the tactile sensation.

On the other hand, if the standard load in releasing to provide the tactile sensation is set too low in comparison with that in pressing to provide the tactile sensation, the feeling of strangeness is inflicted on the operator when a next input operation is performed before the load returns to the standard load in releasing during continuous input as illustrated in FIG. 20, as the tactile sensation out of synchronization is provided. FIG. 20 illustrates a case where a third input in four continuous inputs is operated before a load in releasing on a second input reaches the standard load in releasing. In addition, if the standard load in releasing to provide the tactile sensation is too low as stated above, it takes time to return thereto. As a result, it takes time to allow a next input even when the operator desires to perform input continuously without feeling of strangeness by the sensation provided. Accordingly, the operator is prevented from operating quick continuous input, and thus there is a concern that it may deteriorate operability during continuous input (repetitive tap).

Figure 21:
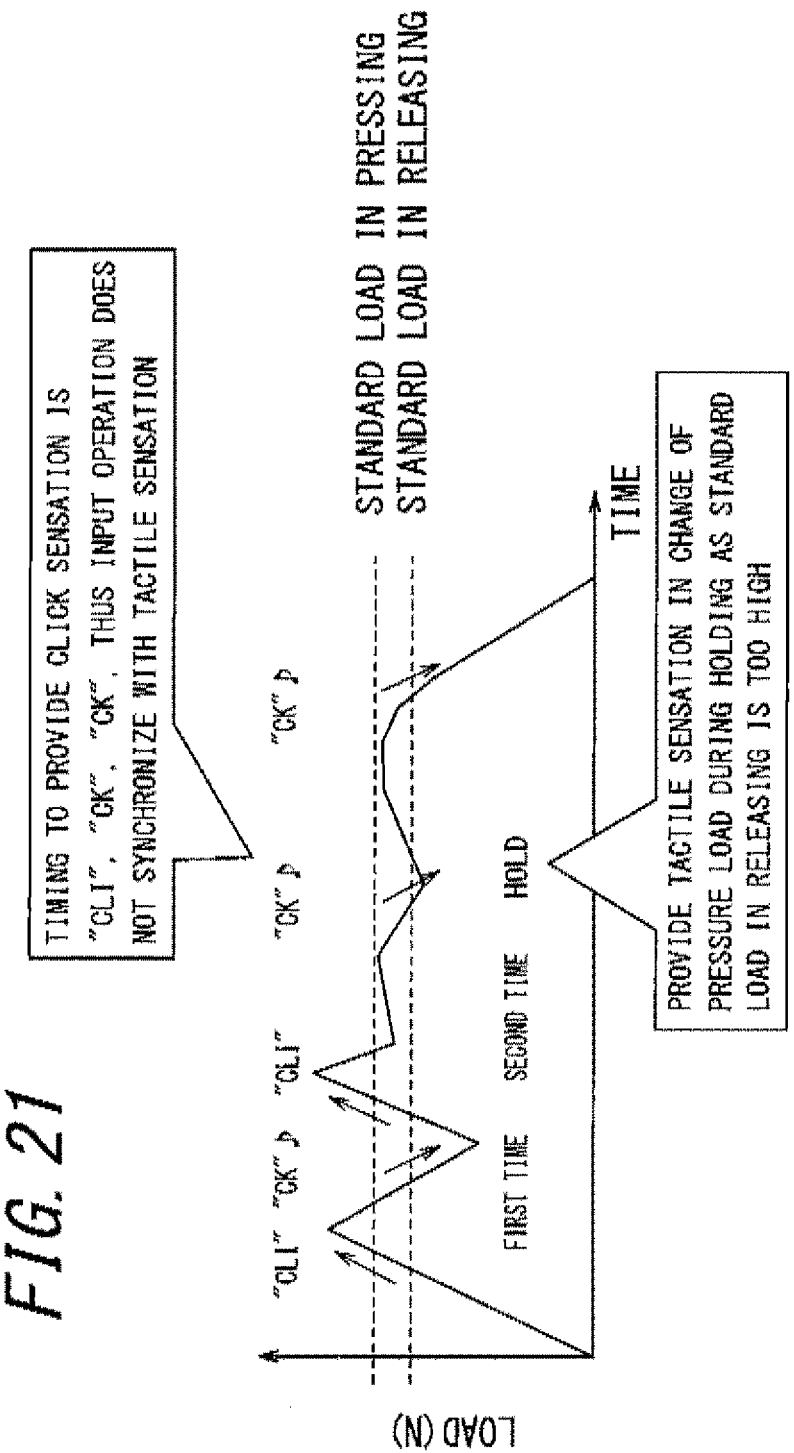
FIG. 21 is a diagram illustrating example of tactile sensations provided during continuous input when the standard load in releasing to provide the tactile sensation is set close to that in pressing to provide the tactile sensation.

In contrast, if the standard load in releasing to provide the tactile sensation is set close to that in pressing to provide the tactile sensation, quicker continuous input is enabled. However, if the operator tries to maintain a pressed state (hold) during continuous input, an unexpected release sensation may be provided to the operator, thus inflicting the feeling of strangeness. That is, when the pressed state is held during continuous input, the load slightly varies even though the operator intends to maintain the pressure load constant. Therefore, as illustrated in FIG. 21, for example, if a load range between the standard load in pressing and that in releasing is smaller than a load variation range in a holding state as described above, the operator is provided with the release sensation despite thinking oneself holding and thus has the feeling of strangeness.

As such, according to the fourth embodiment of the present invention, in order to deal with the operability problem during continuous input described above and slight variation in the load in the holding state and to allow the operator to perform continuous input smoothly with feeling the realistic click sensation and the release sensation, the standard load in releasing to provide the tactile sensation is set to be a value in a range of approximately 50-80% of that in pressing to provide the tactile sensation, using the input apparatus described in the third embodiment.

Figure 22:
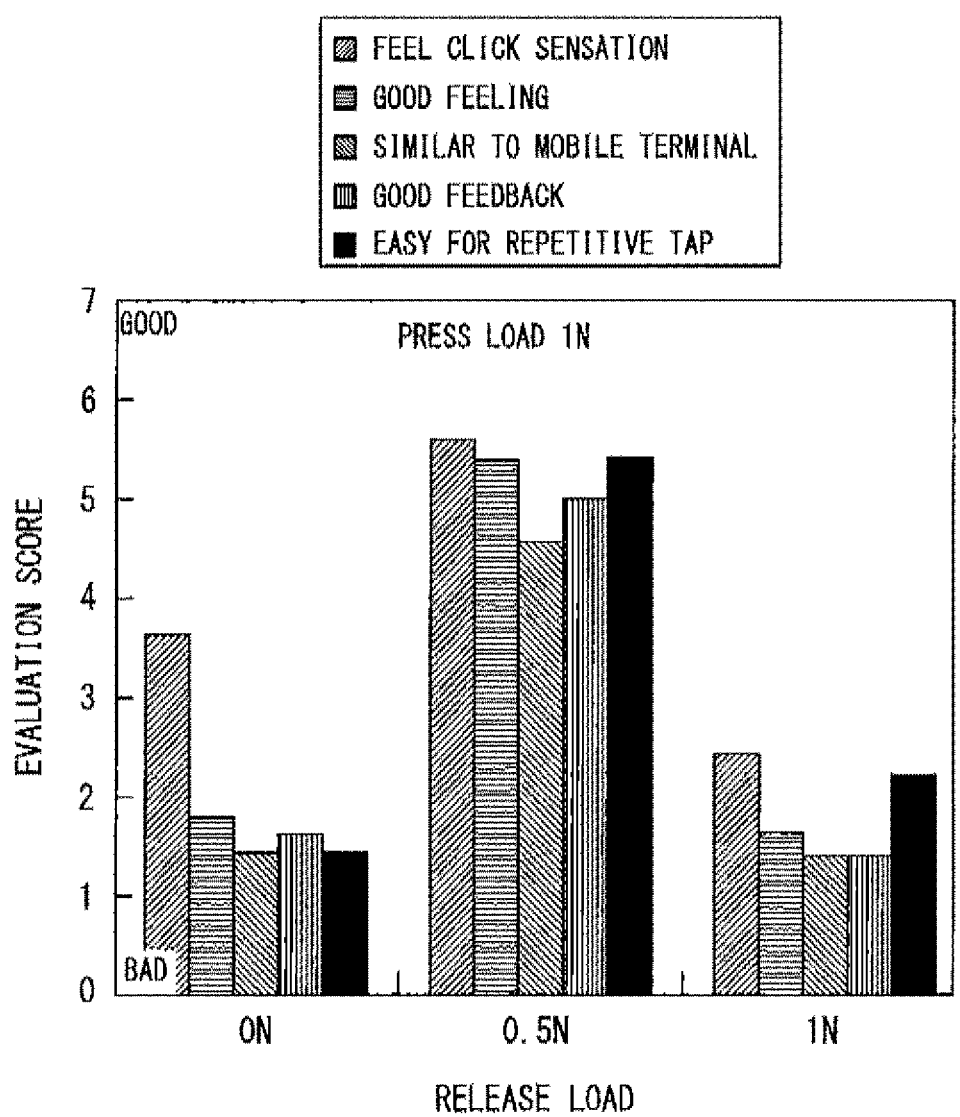
FIG. 22 is a diagram illustrating exemplary results of sensory evaluations on tactile sensations during continuous input when the standard load in pressing to provide the tactile sensation is set to be 1 N.
Figure 23:
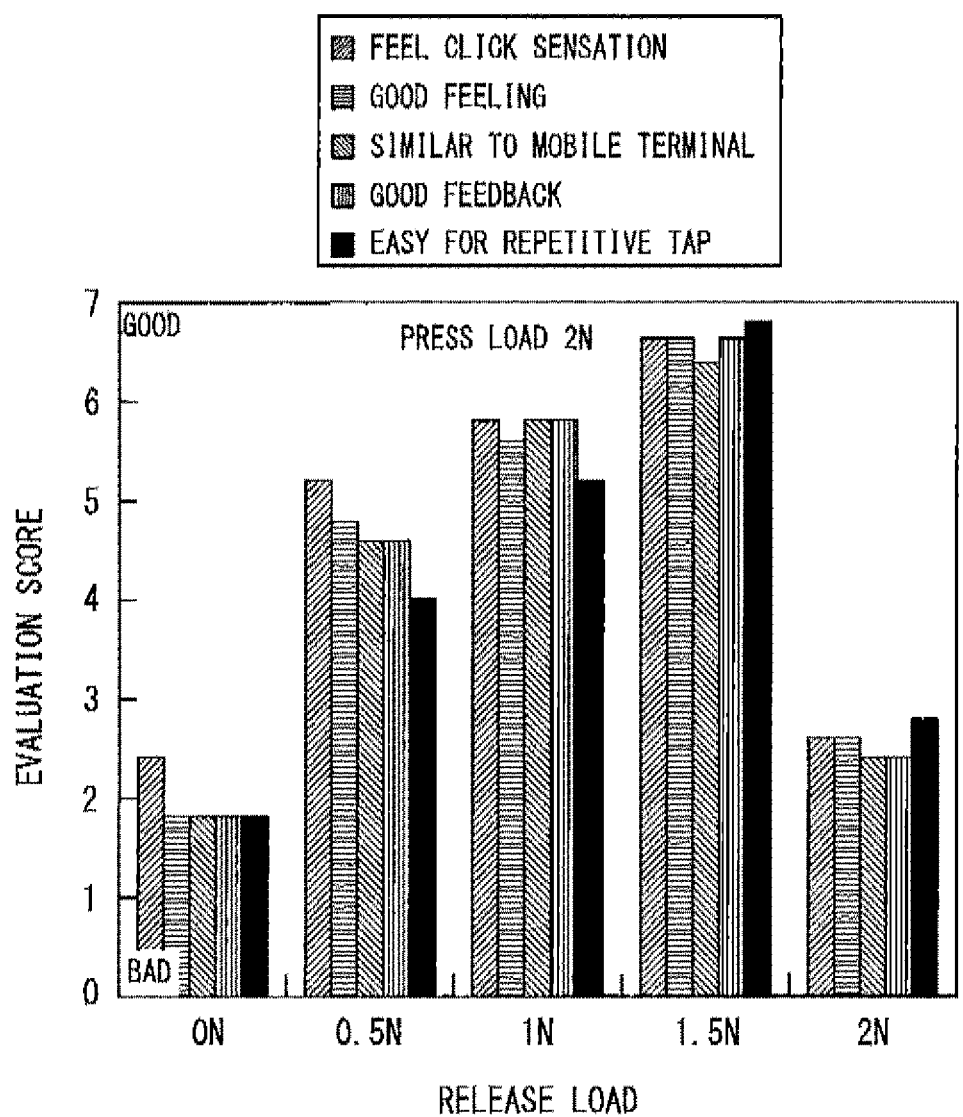
FIG. 23 is a diagram illustrating exemplary results of sensory evaluations on tactile sensations during continuous input when the standard load in pressing to provide the tactile sensation is set to be 2 N.
Figure 24:
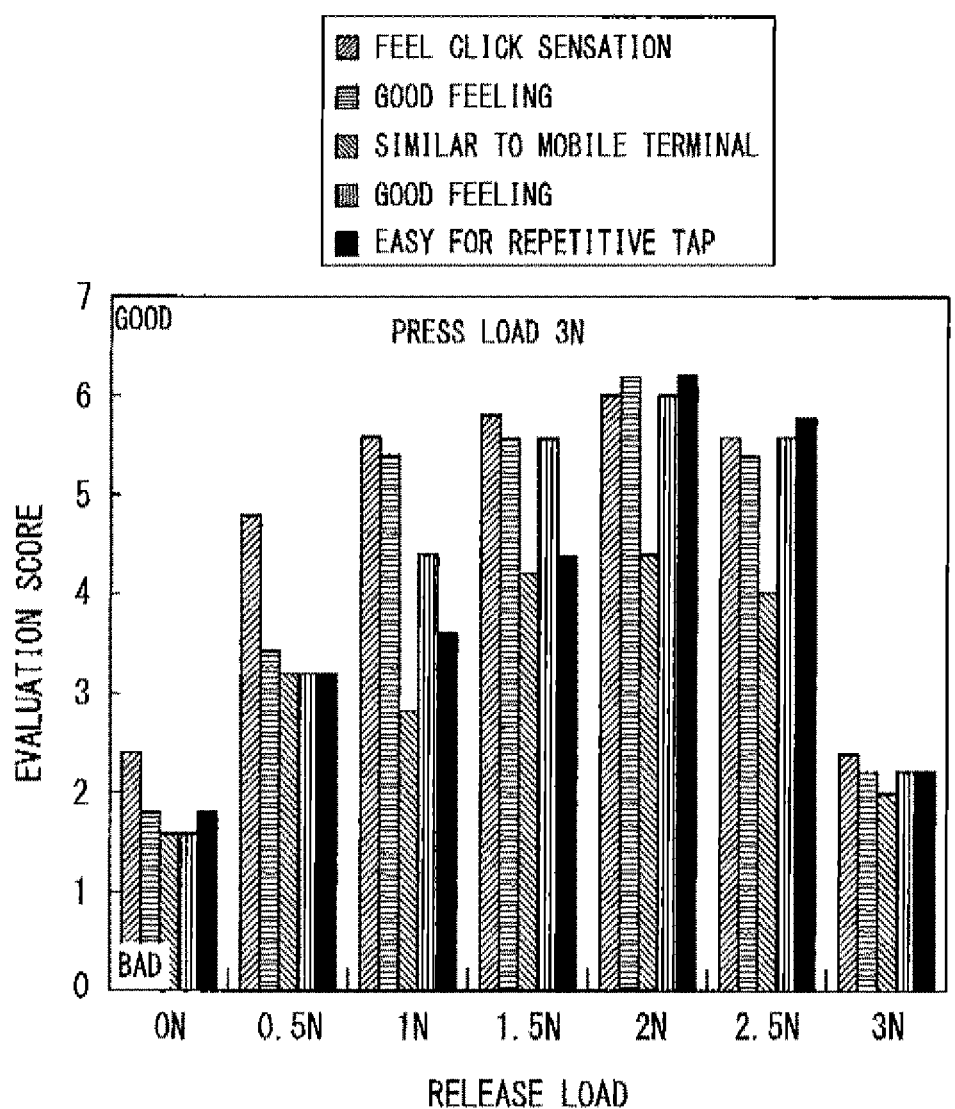
FIG. 24 is a diagram illustrating exemplary results of sensory evaluations on tactile sensations during continuous input when the standard load in pressing to provide the tactile sensation is set to be 3 N.

FIG. 22 to FIG. 24 are diagrams illustrating the results of sensory evaluations on the click sensation during continuous input (repetitive tapping). In the same manner as the results of the sensory evaluations described above, these sensory evaluations were conducted using the input apparatus previously suggested by the applicant.

in FIG. 22 to FIG. 24, the subjects were the same five people involved in the sensory evaluations illustrated in FIG. 18. Evaluation items were five items including "easy for repetitive tap" in addition to the four items in FIG. 18. Each item is on a scale of 1 to 7 and the score of each item represents an average score of the five people. For the item "easy for repetitive tap", "No" scores 1 and "Yes" scores 7. In addition, both in pressing and in releasing, the drive signal to drive the vibration unit (corresponding to the tactile sensation providing unit according to the present invention) was 1 cycle of the sine wave with the frequency of 170 Hz and the amplitude for vibrating the touch sensor by approximately 15 µm when the standard load to provide the tactile sensation was satisfied.

FIG. 22 illustrates results of evaluations when the standard load in pressing to provide the tactile sensation was 1 N and the standard load in releasing to provide the tactile sensation was 0 N, 0.5 N and 1 N. As illustrated in FIG. 22, if the standard load in pressing to provide the tactile sensation was 1 N, the highest evaluations for all items were obtained when the standard load in releasing to provide the tactile sensation was 0.5 N.

FIG. 23 illustrates results of evaluations when the standard load in pressing to provide the tactile sensation was 2 N and the standard load in releasing to provide the tactile sensation was 0 N, 0.5 N, 1 N, 1.5 N and 2 N. As illustrated in FIG. 23, if the standard load in pressing to provide the tactile sensation was 2 N, high evaluations were obtained when the standard load in releasing to provide the tactile sensation was 1 N and 1.5 N. The highest evaluations for all items were obtained especially with 1.5 N.

FIG. 24 illustrates results of evaluations when the standard load in pressing to provide the tactile sensation was 3 N and the standard load in releasing to provide the tactile sensation was 0 N, 0.5 N, 1 N, 1.5 N, 2 N, 2.5 N and 3 N. As illustrated in FIG. 24, if the standard load in pressing to provide the tactile sensation was 3 N, high evaluations were obtained when the standard load in releasing to provide the tactile sensation was 1.5 N, 2 N and 2.5 N. The highest evaluations for all items were obtained especially with 2 N.

From the exemplary results of the evaluations described above, it was confirmed that, if the standard load in releasing to provide the tactile sensation is set to be a value in the range of approximately 50-80% of that in pressing to provide the tactile sensation, it is possible to synchronize sequential inputs and timings to provide the tactile sensation during continuous input (repetitive tapping), and thus the realistic click sensation can be provided without giving the feeling of strangeness. That is, it is prevented from inflicting the feeling of strangeness by setting the standard load in releasing to provide the tactile sensation smaller than that in pressing to provide the tactile sensation, and it is possible to significantly improve the operability during continuous input by setting the standard load in releasing to provide the release sensation approximately 50% or more of the standard load in pressing to provide the release sensation. In addition, it is also possible to deal with slight variations in the load in the holding state during continuous input by setting the standard load in releasing to provide the tactile sensation approximately equal to or less than 80% of that in pressing to provide the tactile sensation.

Accordingly, in the fourth embodiment of the present invention as well, in consideration of the above results of the sensory evaluations, if the standard load in pressing to provide the tactile sensation is set 1 N, for example, the standard load in releasing to provide the tactile sensation is set to be any value from 0.5 N to 0.8 N. In addition, if the standard load in pressing to provide the tactile sensation is high, the load variation range in the holding state is wider than that when that the standard load is low. In such a case also, the standard load in releasing to provide the tactile sensation is set in the range of approximately 50-80% of that in pressing to provide the tactile sensation. For example, if the standard load in pressing to provide the tactile sensation is set to be 6 N, which is a high value, the standard load in releasing to provide the tactile sensation is set to be 3 N-4.8 N. Thereby, the realistic click sensation in synchronization with continuous input is provided without providing unexpected release sensation which causes the feeling of strangeness. The standard load in pressing to provide the tactile sensation and the standard load in releasing to provide the tactile sensation may be set either fixedly or arbitrarily selectably by the user.

(First Exemplary Variation)

Figure 25:
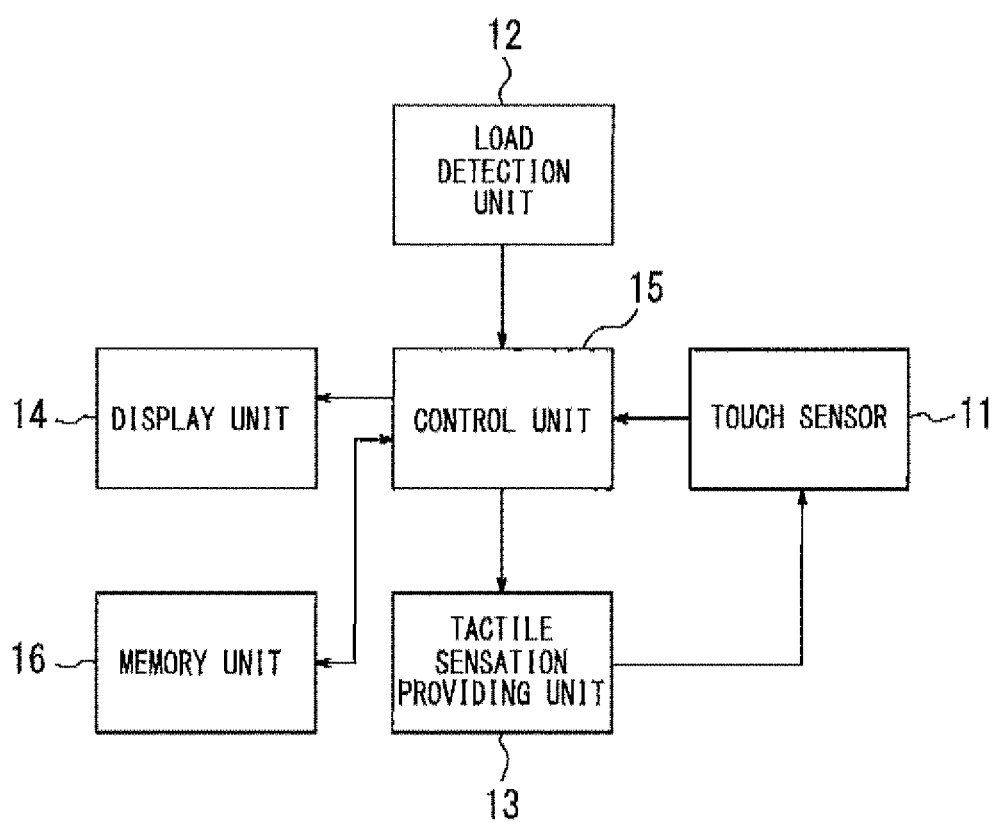
FIG. 25 is a block diagram illustrating a schematic constitution of an input apparatus according to a first exemplary variation of the present invention.

FIG. 25 is a block diagram illustrating a schematic constitution of an input apparatus according to a first exemplary variation of the present invention. This input apparatus has a memory unit 16 in addition to the constitution of the input apparatus according to the first embodiment illustrated in FIG. 1. The memory unit 16 stores (memorizes) drive signal information of the tactile sensation providing unit 13. The memory unit 16 may be an internal memory of the control unit 15. The memory unit 16 also stores drive signal information to provide the click sensation (button depression sensation) at one time. The memory unit 16 may store drive signal information to provide a tactile sensation, which is different from the drive signal information to provide the click sensation (button depression sensation) at one time.

Next, an operation of the input apparatus according to the first exemplary variation will be described with reference to the flowchart illustrated in FIG. 7. The control unit 15 monitors an input to the touch sensor 11 as well as a load detected by the load detection unit 12. The control unit 15 then detects whether the input to the touch sensor 11 by the pressing object (pressing means) such as the finger, the stylus pen and the like is an input to the input object displayed on the display unit 14 at step S701 in FIG. 7. As a result, if detecting that it is the input to the input object, the control unit 15 changes the display state of the portion (input portion) on the display unit 14 contacted by the pressing object (pressing means), by varying color or the like, at step S702 in FIG. 7.

In addition, if detecting that the pressure load detected by the load detection unit 12 increases in accordance with the pressure on the touch sensor 11 and satisfies the standard to provide the tactile sensation at step S703 in FIG. 7, the control unit 15 reads out the predetermined drive signal information (single drive signal information to provide the click sensation (button depression sensation) at one time) from the memory unit 16. Then, at step S704 in FIG. 7, the control unit 15 drives the tactile sensation providing unit 13 once with the drive signal based on the read-out drive signal information. Thereby, the touch sensor 11 is vibrated in the predetermined vibration pattern, such that the click sensation (button depression sensation) is provided once. That is, in the same manner as the first embodiment, the button depression sensation is provided in one provision of the tactile sensation (by one drive).

Here, the standard pressure load to provide the tactile sensation to detect at step S703 can be set in the same manner as the first embodiment set forth above. In addition, the drive signal information of the drive signal to drive the tactile sensation providing unit 13 at step S704 is suitably set according to the click sensation to provide and prestored in the memory unit 16. The drive signal information includes, for example, a frequency, cycle (wavelength), waveform and amplitude to stimulate the tactile sensation as described in the above embodiments. For example, in order to provide the click sensation represented by the metal dome switch used for the mobile terminals, the drive signal information stored has a value of, for example, a sine wave with a constant frequency of 170 Hz, for 1 cycle so as to vibrate the touch face 11a (see FIG. 6) by approximately 15 µm while the standard load is being applied thereon. Then, at a point when the standard load described above is applied, the control unit 15 reads out the predetermined drive signal information from the memory unit 16 and drives the tactile sensation providing unit 13 only once with the drive signal based on the read-out drive signal information. Thereby, it is enabled to provide the operator with the realistic click sensation once, in the same manner as the input apparatus according to the first embodiment.

(Second Exemplary Variation)

Figure 26:
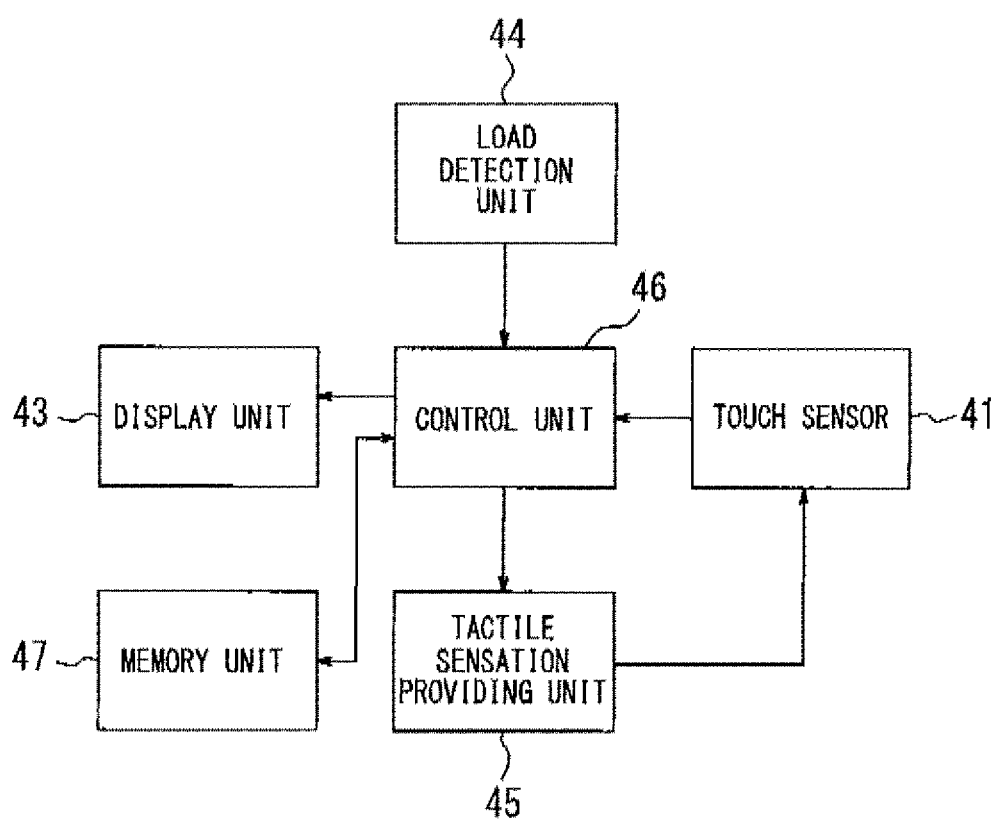
FIG. 26 is a block diagram illustrating a schematic constitution of an input apparatus according to a second exemplary variation of the present invention.

FIG. 26 is a block diagram illustrating a schematic constitution of an input apparatus according to a second exemplary variation of the present invention. This input apparatus has a memory unit 47 in addition to the constitution of the input apparatus according to the second embodiment illustrated in FIG. 8. The memory unit 47 stores (memorizes) the drive signal information of the tactile sensation providing unit 45.

The control unit 46 monitors an input to the touch sensor 41 as well as a load detected by the load detection unit 44. If the pressure load detected by the load detection unit 44 increases in accordance with the pressure on the touch sensor 41 and satisfies the standard to provide the tactile sensation, the control unit 46 reads out the predetermined drive signal information from the memory unit 47. Thereby, the control unit 46 drives the tactile sensation providing unit 45 once with the drive signal based on the read-out drive signal information and vibrates the touch face 41a of the touch sensor 41 in the predetermined vibration pattern.

That is, the control unit 46 detects the pressure load separately from a detection of an input to the effective pressing area of the input object by the touch sensor 41. In addition, in the same manner as the control unit of the input apparatus according to the first exemplary variation, the control unit 46 reads out the drive signal information, which is the same as that of the first exemplary variation, from the memory unit 47 at a point when the pressure load on the touch sensor 41 increases and satisfies the standard to provide the tactile sensation, and drives the tactile sensation providing unit 45 once with the drive signal based on the drive signal information. Thereby, the click sensation is provided to the operator only once. In addition, by receiving the input detected on the touch sensor 41, the control unit 46 displays according to the input on the display unit 43.

Hence, if the standard pressure load to provide the tactile sensation is set to be a load at which the touch sensor 41 responds or higher, the operator, in the same manner as the first exemplary variation, can perform the input operation to the touch sensor 41 with feeling the realistic click sensation similar to that obtained when operating the push-button switch, thus the operator does not have the feeling of strangeness. Moreover, since the operator performs the input operation in conjunction with the perception to "have tapped" the touch sensor 41, the erroneous input caused by mere tapping is prevented.

(Third Exemplary Variation)

According to a third exemplary variation of the present invention, the tactile sensation is provided to the operator in releasing as well (hereinafter, the tactile sensation in releasing is referred to as the release sensation, appropriately) in the same manner as the third embodiment, by using the input apparatus according to the first and second exemplary variations. Thereby, the realistic tactile sensation more similar to that obtained when operating the push-button switch is provided to the operator. The following is a description of an operation by the input apparatus according to the third exemplary variation with reference to the constitution illustrated in FIG. 25, by way of example. The information on the drive signal (drive signal information) to drive the tactile sensation providing unit in releasing is prestored in the memory unit 16 in the same manner as the drive signal information of pressing.

Now, the operation of the input apparatus according to the third exemplary variation will be described with reference to the flowchart illustrated in FIG. 15. As already described with reference to FIG. 15, if detecting that an input to the touch sensor 11 is the input to the input object displayed on the display unit 14 (step S1501), the control unit 15 changes the display state of a portion (input portion) on the display unit 14 contacted by the pressing object (pressing means), by varying color or the like (step S1502).

In addition, if detecting the pressure load detected by the load detection unit 12 increases in accordance with the pressure on the touch sensor 11 and satisfies the standard to provide the tactile sensation (step S1503), the control unit 15 reads out the predetermined drive signal information from the memory unit 16 and drives the tactile sensation providing unit 13 once with the driving signal based on the read-out drive signal information. Thereby, the touch sensor 11 is vibrated in the predetermined vibration pattern (step S1504), such that the click sensation is provided only once to the operator via the pressing object (pressing means) pressing the touch sensor 11. Here, in the same manner as the above embodiments, the standard pressure load to provide the click sensation is set equal to the pressure load at which the touch sensor 11 responds, that is, detects the input, or higher.

Then, in releasing, if detecting the load detected by the load detection unit 12 satisfies the standard to provide the tactile sensation (step S1505), the control unit 15 reads out the predetermined drive signal information from the memory unit 16 and drives the tactile sensation providing unit 13 once with the drive signal based on the predetermined drive signal information, in the same manner as that in pressing. Thereby, the touch sensor 11 is vibrated in the predetermined vibration pattern (step S1506), such that the release sensation is provided only once to the operator via the pressing object (pressing means) pressing the touch sensor 11. In addition, almost simultaneously with drive of the tactile sensation providing unit 13, the control unit 15 changes the display state of the portion (input portion) on the display unit 14 contacted by the pressing object (pressing means), by returning to its initial state or the like (step S1507). Thereby, it allows the operator to recognize that the input operation is completed.

(Fourth Exemplary Variation)

According to a fourth exemplary variation of the present invention, for the input apparatus described in the third exemplary variation, the standard load in releasing to provide the tactile sensation is set to be a value in the range of approximately 50-80% of that in pressing to provide the tactile sensation. Thereby, in the same manner as the fourth embodiment, it is enabled to deal with the operability problem during continuous input and slight variation in the load in the holding state and to allow the operator to perform continuous input smoothly with feeling the realistic click sensation and the release sensation.

It is to be understood that the present invention is not limited to the embodiments and the exemplary variations set forth above and various modifications and changes may be implemented. For example, the load detection unit may be constituted of any number of strain gauge sensors. In addition, the load detection unit can be constituted without using the strain gage sensor if capable of detecting a load in accordance with an input detection type of the touch sensor, that is, detecting a load from a change of the output signal based on a resistance change according to a contact area in using the resistive film type, or based on a change in capacitance in using the capacitive type. In addition, the tactile sensation providing unit may be constituted of any number of piezoelectric vibrators, transparent piezoelectric elements provided on an entire surface of the touch sensor, or an eccentric motor which rotates 1 revolution in 1 cycle of the drive signal. Moreover, the load detection unit and the tactile sensation providing unit can share the piezoelectric elements if both units are constituted of the piezoelectric elements.

In addition, the control unit may be configured to change the drive signal to drive the tactile sensation providing unit based on an input position detected by the touch sensor in order to change the click sensation.

The present invention is effectively applicable to an input apparatus in which the touch sensor serves as a touch switch for on/off operation. Also, the input apparatus according to the present invention is capable of providing feelings of a multistep switch, such as a two-step switch (pressed further after pressed), by sequentially providing the click sensation on different standards (loads) while the touch sensor is being pressed. Thereby, if the input apparatus is applied to a release button of a camera, for example, it can provide one tactile sensation for each of lock focus (first step) and release (second step). In addition, in combination with the display unit, the input apparatus can change a display of a menu screen and the like in a variety of manners in accordance with the steps in pressing. Moreover, when providing the feelings of the multistep switch, it is possible to change the drive signal to vibrate the touch face by the tactile sensation providing unit at each step in order to provide a different click sensation once at each step.

According to the present invention, the vibration unit is driven once when the load detected by the load detection unit satisfies a standard to provide the tactile sensation. The time "when the load detected by the load detection unit satisfies the standard to provide the tactile sensation" includes times "when the pressure load detected by the load detection unit reaches the standard load to provide the tactile sensation", "when the pressure load detected by the load detection unit exceeds the standard load to provide the tactile sensation", or "when the standard load to provide the tactile sensation is detected by the load detection unit".

The control unit vibrates the touch sensor in a predetermined vibration pattern by driving the tactile sensation providing unit once when the pressure load detected by the load detection unit satisfies the standard to provide the tactile sensation, and such predetermined vibration pattern in pressing may be one as illustrated by the solid line in FIG. 4, whereas that in releasing may be another as illustrated by the dashed line in FIG. 4. Vibration of the touch sensor in those manners can provide the click sensation (vibration stimulus), similar to that obtained when operating the pushbutton switch, to the operator.

REFERENCE SIGNS LIST 11 touch sensor
11a touch face
12 load detection unit
13 tactile sensation providing unit
14 display unit
15 control unit
16 memory unit
21 housing
22 insulator
23 upper cover
24 insulator
31 strain gauge sensor
32 piezoelectric vibrator
41 touch sensor
41a input object
43 display unit
44 load detection unit
45 tactile sensation providing unit
46 control unit
47 memory unit

The invention claimed is:

1. An input apparatus comprising:
a display unit;
a touch sensor configured to receive an input;
a load detection unit configured to detect a pressure load on a touch face of the touch sensor;
a tactile sensation providing unit configured to vibrate the touch face; and
a control unit configured to control drive of the tactile sensation providing unit, when the pressure load detected by the load detection unit satisfies each of a plurality of different standards to provide the tactile sensation, such that a click sensation and a release sensation are provided sequentially and once for each one of the plurality of different standards of input to a multistep switch and to an object pressing the touch face, wherein
the load detection unit and the tactile sensation providing unit share an element that reacts to the pressure load and is configured to vibrate the touch face,
the control unit changes a display of the display unit at a same input position in accordance with steps in pressing, and
the plurality of different standards comprises a first standard pressure load for providing the click sensation and a second standard pressure load for providing the release sensation, the first standard pressure load being higher than the second standard pressure load.

2. A control method for an input apparatus including
a display unit;
a touch sensor configured to receive an input;
a load detection unit configured to detect a pressure load on a touch face of the touch sensor; and
a tactile sensation providing unit configured to vibrate the touch face,
the control method comprising a step of, controlling drive of the tactile sensation providing unit, when the pressure load detected by the load detection unit satisfies each of a plurality of different standards to provide the tactile sensation, such that a click sensation and a release sensation are provided sequentially and once for each one of the plurality of different standards of input to a multistep switch and to an object pressing the touch face, and changing a display of the display unit at a same input position in accordance with steps in pressing, wherein
the load detection unit and the tactile sensation providing unit share an element that reacts to the pressure load and is configured to vibrate the touch face, and
the plurality of different standards comprises a first standard pressure load for providing the click sensation and a second standard pressure load for providing the release sensation, the first standard pressure load being higher than the second standard pressure load.

3. A tactile sensation providing apparatus comprising:
a display unit;
a touch sensor configured to receive an input;
a load detection unit configured to detect a pressure load on a touch face of the touch sensor;
a tactile sensation providing unit configured to vibrate the touch face;
a memory unit configured to store drive signal information of the tactile sensation providing unit; and
a control unit configured to read out the drive signal information from the memory unit, when the pressure load detected by the load detection unit satisfies each of a plurality of different standards to provide a tactile sensation, and to control drive of the tactile sensation providing unit based on the drive signal information, such that a click sensation and a release sensation are provided sequentially and once for each one of the plurality of different standards of input to a multistep switch and to an object pressing the touch face, wherein
the load detection unit and the tactile sensation providing unit share an element that reacts to the pressure load and is configured to vibrate the touch face,
the control unit changes a display of the display unit at a same input position in accordance with steps in pressing, and
the plurality of different standards comprises a first standard pressure load for providing the click sensation and a second standard pressure load for providing the release sensation, the first standard pressure load being higher than the second standard pressure load.

4. A control method for a tactile sensation providing apparatus including
a display unit;
a touch sensor configured to receive an input;
a load detection unit configured to detect a pressure load on a touch face of the touch sensor;
a tactile sensation providing unit configured to vibrate the touch face, wherein
the load detection unit and the tactile sensation providing unit share an element that reacts to the pressure load and is configured to vibrate the touch face; and
a memory unit configured to store drive signal information of the tactile sensation providing unit,
the control method comprising the steps of:
reading out the drive signal information from the memory unit, when the pressure load detected by the load detection unit satisfies each of a plurality of different standards to provide a tactile sensation,
controlling drive of the tactile sensation providing unit based on the drive signal information, such that a click sensation and release sensation are provided sequentially and once for each one of the plurality of different standards of input to a multistep switch and to an object pressing the touch face, and
changing a display of the display unit at a same input position in accordance with steps in pressing, wherein
the plurality of different standards comprises a first standard pressure load for providing the click sensation and a second standard pressure load for providing the release sensation, the first standard pressure load being higher than the second standard pressure load.

* * * * *